US012809286B2

(12) United States Patent
Meng et al.

(10) Patent No.: US 12,809,286 B2

(45) Date of Patent: Nov. 24, 2026

(54) DETECTION BASEBOARD AND CONTROL METHOD THEREOF, DETECTION DEVICE, AND PRINTING DEVICE

(71) Applicants: Beijing BOE Technology Development Co., Ltd., Beijing (CN); BOE Technology Group Co., Ltd., Beijing (CN)

(72) Inventors: Fanli Meng, Beijing (CN); Zeyuan Li, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 335 days.

(21) Appl. No.: 18/284,125

(22) PCT Filed: Nov. 16, 2022

(86) PCT No.: PCT/CN2022/132357

§ 371 (c)(1),
(2) Date: Sep. 26, 2023

(87) PCT Pub. No.: WO2024/103311

PCT Pub. Date: May 23, 2024

(65) Prior Publication Data

US 2025/0085648 A1 Mar. 13, 2025

(51) Int. Cl.

| | |
|---|---|
| ***B41J 2/385*** | (2006.01) |
| ***G03G 5/04*** | (2006.01) |
| ***G03G 15/00*** | (2006.01) |
| ***G03G 15/02*** | (2006.01) |

(Continued)

(52) U.S. Cl.

CPC .......... *G03G 15/0266* (2013.01); *B41J 2/385* (2013.01); *G03G 5/04* (2013.01);

(Continued)

(58) Field of Classification Search

CPC ........... G03G 15/0266; G03G 15/0409; G03G 15/80; G03G 5/04; B41J 2/385; H10D 30/6757; H10F 39/12

See application file for complete search history.

(56) References Cited

U.S. PATENT DOCUMENTS

| | | |
|---|---|---|
| 5,371,025 A | 12/1994 | Sung |
| 6,239,468 B1 | 5/2001 | Chang et al. |

(Continued)

FOREIGN PATENT DOCUMENTS

| | | |
|---|---|---|
| CN | 105789317 A | 7/2016 |
| CN | 106816473 A | 6/2017 |

(Continued)

OTHER PUBLICATIONS

Extended (Supplementary) European Search Report dated Nov. 13, 2025, issued in counterpart EP Application No. 22965495.9. (11 pages).

*Primary Examiner* — Yaovi M Ameh

(74) *Attorney, Agent, or Firm* — WHDA, LLP

(57) ABSTRACT

Provided are a detection baseboard and a preparation method thereof, a detection device, a printing device. The detection baseboard includes: a substrate; a plurality of data lines and a plurality of gate lines; a plurality of sub-pixels arranged in an array, the sub-pixels being located at positions defined by the data lines and the gate lines, the sub-pixels being electrically connected to the data lines and the gate lines respectively; the sub-pixel includes a control unit and a charge distribution unit, the control unit is electrically connected to the data line and the gate line, the charge distribution unit includes a first electrode electrically connected to the control unit and a charge transport layer, an orthographic projection of the charge transport layer on the substrate covers an orthographic projection of the first (Continued)

electrode on the substrate; the charge distribution unit is configured to discharge under control of the control unit.

19 Claims, 10 Drawing Sheets

(51) Int. Cl.
*G03G 15/04* (2006.01)
*H10D 30/67* (2025.01)
*H10F 39/12* (2025.01)

(52) U.S. Cl.
CPC ......... *G03G 15/0409* (2013.01); *G03G 15/80* (2013.01); *H10D 30/6757* (2025.01); *H10F 39/12* (2025.01)

(56) References Cited

U.S. PATENT DOCUMENTS

| | | | | |
|---|---|---|---|---|
| 2010/0201777 | A1* | 8/2010 | Skorokhod | B41J 2/39 347/159 |
| 2012/0183307 | A1* | 7/2012 | Law | G03G 15/5087 399/8 |
| 2022/0093658 | A1 | 3/2022 | Chen et al. | |
| 2022/0131025 | A1 | 4/2022 | Shang et al. | |

FOREIGN PATENT DOCUMENTS

| | | | | |
|---|---|---|---|---|
| CN | 110061062 | A | 7/2019 | |
| CN | 110085677 | A | 8/2019 | |
| CN | 112133717 | A | 12/2020 | |
| CN | 113410258 | A * | 9/2021 | H10F 39/811 |
| CN | 113721432 | A * | 11/2021 | G03G 5/00 |
| CN | 114388538 | A | 4/2022 | |
| CN | 114864665 | A | 8/2022 | |
| JP | 2000-164882 | A | 6/2000 | |
| KR | 940007451 | B1 | 8/1994 | |
| KR | 20000038925 | A | 7/2000 | |

* cited by examiner

DETECTION BASEBOARD AND CONTROL METHOD THEREOF, DETECTION DEVICE, AND PRINTING DEVICE

TECHNICAL FIELD

The present disclosure relates to the field of detection technology, in particular to a detection baseboard and a preparation method thereof, a detection device, and a printing device.

BACKGROUND

With the continuous development of detection technology, detection baseboards or detection devices have a broad application prospect in fields such as industrial non-destructive testing, container scanning, circuit board inspection, medical treatment and security. However, the existing detection technology is generally based on a conversion process from the optical signal to the electrical signal, and the optical signal has a great influence on the accuracy of detection, and is easily interfered by the external light.

SUMMARY

Embodiments of the present disclosure adopt technical solutions described below.

In a first aspect, an embodiment of the present disclosure provides a detection baseboard, including:

a substrate;

a plurality of data lines extending in a first direction and a plurality of gate lines extending in a second direction located on the substrate, wherein the first direction intersects with the second direction;

a plurality of sub-pixels arranged in an array, the sub-pixels are located at positions defined by the data lines and the gate lines, and the sub-pixels are electrically connected to the data lines and the gate lines respectively;

wherein each of the sub-pixels includes a control unit and a charge distribution unit, the control unit is electrically connected to the data line and the gate line, the charge distribution unit includes a first electrode and a charge transport layer, the first electrode is electrically connected to the control unit, and an orthographic projection of the charge transport layer on the substrate covers an orthographic projection of the first electrode on the substrate; the charge distribution unit is configured to discharge under the control of the control unit.

In a detection baseboard provided by an embodiment of the present disclosure, the detection baseboard also includes a first signal line that is electrically connected to the control unit, when the charge distribution unit is in a full charge state, the voltage of the signal transmitted in the first signal line is less than the voltage of the first electrode;

wherein the first signal line is configured to transmit a signal with a constant voltage, and the charge distribution unit is configured to discharge to the first signal line along the control unit under the control of the control unit.

In a detection baseboard provided by an embodiment of the present disclosure, the first signal line includes a ground line or a negative power supply signal line.

In a detection baseboard provided by an embodiment of the present disclosure, the control unit includes at least two transistors, one of the at least two transistors is electrically connected to the data line, and the other one of the at least two transistors is electrically connected to the first signal line.

In a detection baseboard provided by an embodiment of the present disclosure, the charge distribution unit further includes a buffer layer and a charge injection layer, the buffer layer is located between the first electrode and the charge transport layer, and the charge injection layer is located between the buffer layer and the charge transport layer, wherein a polarity of charges injected by the charge injection layer is same as a polarity of charges transported by the charge transport layer.

In a detection baseboard provided by an embodiment of the present disclosure, the control unit includes a first transistor and a second transistor, a gate of the first transistor is electrically connected to the data line, a first terminal of the first transistor is electrically connected to the first electrode, and a second terminal of the first transistor is electrically connected to a first terminal of the second transistor; a gate of the second transistor is electrically connected to the gate line, and a second terminal of the second transistor is electrically connected to the first signal line.

In a detection baseboard provided by an embodiment of the present disclosure, the control unit includes a first transistor and a second transistor, a gate of the first transistor is electrically connected to the data line, a first terminal of the first transistor is electrically connected to the first electrode, and a second terminal of the first transistor is shared with a first terminal of the second transistor; a gate of the second transistor is electrically connected to the gate line, and a second terminal of the second transistor is electrically connected to the first signal line.

In a detection baseboard provided by an embodiment of the present disclosure, the control unit includes a first transistor and a second transistor, a gate of the first transistor is electrically connected to the gate line, a first terminal of the first transistor is electrically connected to the data line, and a second terminal of the first transistor is electrically connected to a gate of the second transistor; a first terminal of the second transistor is electrically connected to the first electrode, and a second terminal of the second transistor is electrically connected to the first signal line.

In a detection baseboard provided by an embodiment of the present disclosure, the charge transport layer includes a hole transport layer, and each transistor in the control unit is a P-type transistor.

In a detection baseboard provided by an embodiment of the present disclosure, the charge transport layer includes an electron transport layer, and each transistor in the control unit is a N-type transistor.

In a detection baseboard provided by an embodiment of the present disclosure, the detection baseboard includes:

a first conductive layer located on a side of the substrate, wherein the first conductive layer includes the gate lines and a gate electrode of each of the transistors;

a semiconductor layer located on a side of the first conductive layer facing away from the substrate, wherein the semiconductor layer is insulated from the first conductive layer and includes an active region of each of the transistors;

a second conductive layer located on a side of the semiconductor layer facing away from the substrate, wherein the second conductive layer includes the data lines and a source and a drain of each of the transistors;

wherein for at least one transistor in the control unit, an orthographic projection of the gate of on the substrate partially overlaps with an orthographic projection of the active region on the substrate.

In a detection baseboard provided by an embodiment of the present disclosure, the orthographic projection of the gate of the first transistor on the substrate partially overlaps with the orthographic projection of the active region of the first transistor on the substrate;

the active region of the first transistor includes a plurality of active parts and first bending parts connecting two adjacent active parts, and the orthographic projection of some of the first bending parts on the substrate is within the orthographic projection of the gate on the substrate.

In a detection baseboard provided by an embodiment of the present disclosure, the orthographic projection of the gate of the first transistor on the substrate partially overlaps with the orthographic projection of the active region of the first transistor on the substrate;

the active region of the first transistor includes a plurality of active parts, the second conductive layer includes a plurality of second bending parts, and two adjacent active parts are electrically connected through the second bending part; the orthographic projection of the second bending part on the substrate and the orthographic projection of the gate on the substrate do not overlap with each other.

In a detection baseboard provided by an embodiment of the present disclosure, a gap exists between two adjacent active parts, an area delineated by the orthographic projection of the gate on the substrate at least partially overlaps with an area delineated by the orthographic projection of an outer contour of a part of the gaps on the substrate.

In a detection baseboard provided by an embodiment of the present disclosure, the detection baseboard further includes a pixel definition layer and a plurality of pixel isolation structures, the pixel definition layer is located on a side of the first electrode facing away from the substrate, the charge transport layer is located on a side of the pixel definition layer facing away from the substrate;

the pixel definition layer includes a plurality of first openings and a plurality of second openings, an area delineated by the orthographic projection of the first electrode on the substrate overlaps with an area delineated by an outer contour of the first opening on the substrate, an area enclosed by the orthographic projection of the pixel isolation structure on the substrate overlaps with an area enclosed by the orthographic projection of an outer contour of the second opening on the substrate;

each pixel isolation structure is located between two adjacent sub-pixels, and the charge transport layer is disconnected at the pixel isolation structures.

In a detection baseboard provided by an embodiment of the present disclosure, the substrate is a flexible substrate.

In a detection baseboard provided by an embodiment of the present disclosure, in a first state, the charge transport layers in each of the sub-pixels are located on the same plane;

in a second state, the charge transport layers in each of the sub-pixels are located on a same curved surface, and a solid figure of the detection baseboard in the second state includes a cylinder.

In a detection baseboard provided by an embodiment of the present disclosure, the detection baseboard further includes a first insulation layer, an organic layer and a second insulation layer that are stacked in sequence, the first insulation layer covers the control units, and the second insulation layer is located on a side of each of the first electrodes close to the substrate;

the first insulation layer is provided with a plurality of grooves in a region between two adjacent control units, and the organic layer extends into the grooves.

In a detection baseboard provided by an embodiment of the present disclosure, a material of the semiconductor layer includes metal oxide, the detection baseboard further includes an etch stop layer covering the semiconductor layer, and the second conductive layer is located on a side of the etch stop layer facing away from the substrate.

In a second aspect, an embodiment of the present disclosure provides a detection device, including any one of the detection baseboards as described in the first aspect.

In a third aspect, an embodiment of the present disclosure provides a printing device, including any one of the detection baseboards as described in the first aspect. The printing device further includes a charging device and a driving chip, the charging device is configured to charge the charge distribution unit of the detection substrate, and the driving chip is configured to transmit a control signal to the detection baseboard.

In a fourth aspect, an embodiment of the present disclosure provides a method for controlling a detection baseboard, applied to any one of the detection baseboards as described in the first aspect, and the method includes:

charging the detection baseboard so that the charge distribution unit is in a full charge state;

inputting a first control signal to the control units of some of the sub-pixels, wherein the first control signal is configured to control the charge distribution unit of the sub-pixel to discharge so that the surface of the charge distribution unit is not carried with charges;

inputting a second control signal to the control units of some of the sub-pixels, wherein the second control signal is configured to control the charge distribution unit of the sub-pixel to hold charges to obtain the detection baseboard with a charge pattern.

The above explanation is merely an overview of the technical solutions of the present disclosure. In order to know about the technical means of the present disclosure more clearly so that the solutions according to the contents of the specification may be implemented, and in order to make the above and other objects, features and advantages of the present disclosure more apparent and understandable, specific implementations of the present disclosure are set forth below.

BRIEF DESCRIPTION OF THE DRAWINGS

In order to describe technical solutions of the embodiments of the present disclosure or the related art more clearly, the accompanying drawings used in the illustration of the embodiments or the related art will be briefly introduced. Apparently, the accompanying drawings in the following explanation illustrate merely some embodiments of the present disclosure, and those skilled in the art may obtain other accompanying drawings based on these accompanying drawings without paying any creative effort.

DETAILED DESCRIPTION

A clear and thorough description for technical solutions in embodiments of the present disclosure will be given below in conjunction with the accompanying drawings in the embodiments of the present disclosure. Apparently, the described embodiments are a part of embodiments of the present disclosure, not all the embodiments. All other embodiments obtained, based on the embodiments in the present disclosure, by those skilled in the art without paying creative effort fall within the protection scope of the present disclosure.

Unless it is additionally defined in the context, otherwise, the term "comprising/including" throughout the specification and claims is interpreted in an open and inclusive sense, that is, "including, but not limited to". In the description of the specification, the terms "an embodiment", "some embodiments", "an exemplary embodiment", "an example", "specific examples" or "some examples" are intended to indicate that specific features, structures, materials or characteristics related to the embodiment or example are included in at least one embodiment or example of the present disclosure. Schematic representations of the above terms do not necessarily refer to the same embodiment or example. Furthermore, the particular features, structures, materials or characteristics described may be included in any suitable manner in any one or more embodiments or examples.

In addition, it should be noted that when an element or implementation thereof the present application are introduced, the articles "a", "an", "the" and "said" are intended to indicate that there are one or more elements. Unless it is otherwise stated, "a plurality of" means two or more; the terms "comprising", "including". "containing" and "having" are intended to be inclusive and mean that there may be additional elements other than the listed elements. The terms "first". "second". "third", etc. are only used for descriptive purposes, and should not be construed as indicating or implying relative importance and the order of formation.

In this specification, "electrical connection" includes the case where constituent elements are connected together through an element having a certain electrical effect. An "element having a certain electrical function" is not particularly limited as long as it can transmit and receive electrical signals between constituent elements of the connection. Examples of "elements having a certain electrical function" include not only electrodes and wiring, but also switching elements such as transistors, resistors, inductors, capacitors, and other elements having various functions.

Polygons mentioned in this specification are not strictly defined, and may be approximate triangles, rectangles, trapezoids, pentagons or hexagons, etc. There may be some small deformations caused by tolerances, and there may be chamfers, rounded corners, are edges and deformations and the like.

Figure 1:
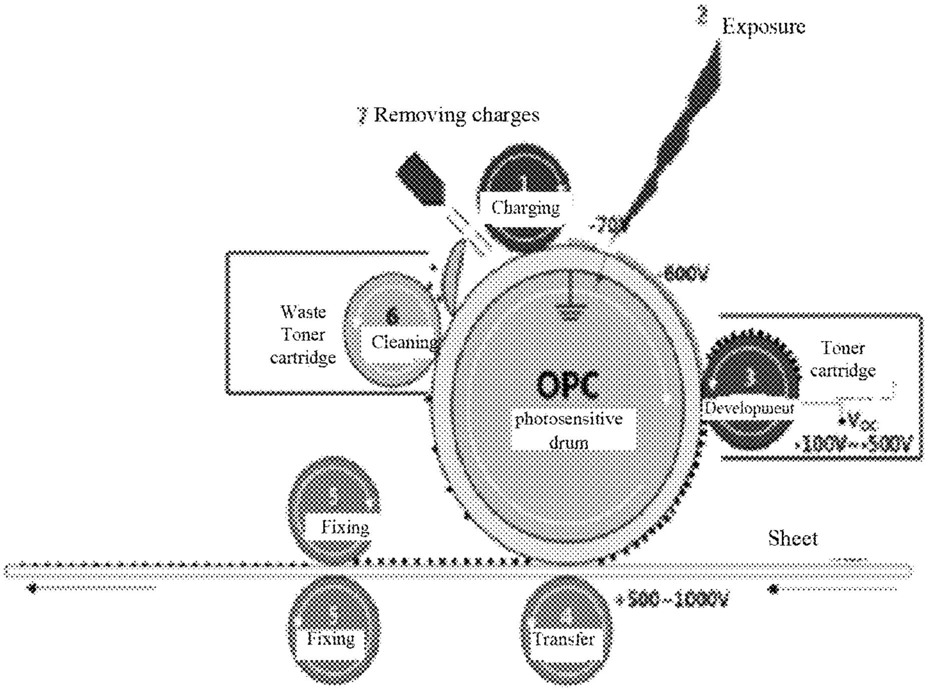
FIG. 1 is a schematic diagram illustrating a printing principle of a laser printer in the related art provided by an embodiment of the present disclosure.
Figure 2:
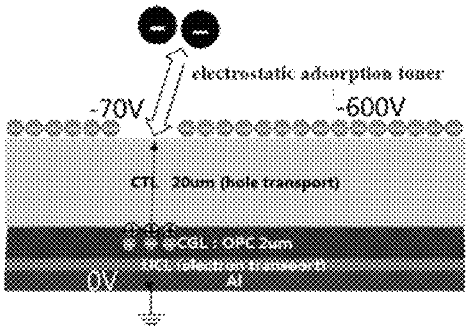
FIG. 2 is a schematic diagram illustrating an exposure discharge process in the related art provided by an embodiment of the present disclosure.
Figure 3:
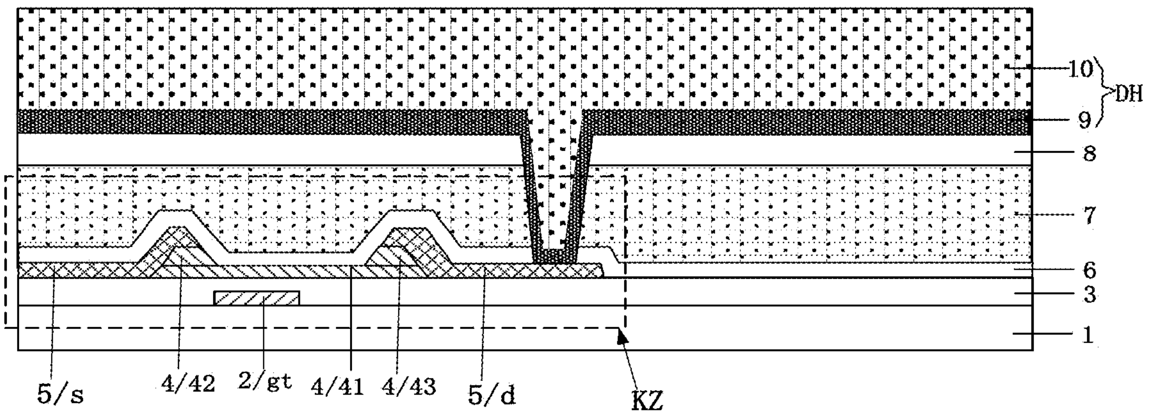
FIG. 3 to FIG. 6 are structural schematic diagrams illustrating four types of detection baseboards provided by embodiments of the present disclosure.

As shown in FIG. 1, Xerography mainly includes the following steps: imaging (charging, exposure), inking (development), toner transferring (transfer printing), fixing, and cleaning. Imaging process is used for forming a charge pattern by charging a suitable photoreceptor surface (for example a photosensitive surface OPC of a photosensitive drum) and controlling the photoreceptor surface to be exposed to a light source. The development process is as follows: when the photosensitive drum carrying charges at specific positions passes through the toner cartridge, due to the electrostatic adsorption effect, the photosensitive drum will absorb a certain amount of toner at positions where charges are carried. At this time, the pattern on the photosensitive drum is the pattern needed, thereby forming a printed image. The printed image corresponds to the location of the light signal on the photo-conductive drum (the photosensitive drum). The photoreceptor is a photosensitive material on the photosensitive drum, which has a very high resistivity in a dark environment (that is, similar to an insulator), and will quickly become a conductor after being irradiated by light. It should be noted that, a process of forming the charge pattern means that a partial region of the uniformly charged photoreceptor surface is discharged through exposure (the resistance of the irradiated region becomes smaller, and the charges disappear, as shown in FIG. 2, the charges in the region marked with −70V gradually disappear), so that the exposed region is consistent with the region of the desired printed image. This process has a high precision requirement on light control, and the exposure process is easily disturbed by external light. The structure shown in FIG. 2 is the surface structure of the photosensitive drum in FIG. 1.

In view of the above, embodiments of the present disclosure provide a detection baseboard and a preparation method thereof, a detection device, and a printing device. The detection baseboard includes: a substrate; a plurality of data lines extending in a first direction and a plurality of gate lines extending in a second direction on the substrate, the first direction intersects with the second direction; a plurality of sub-pixels arranged in an array, the sub-pixels are located at positions defined by the data lines and the gate lines, and electrically connected to the data lines and the gate lines respectively. The sub-pixel includes: a control unit electrically connected to the data line and the gate line, respectively, and a charge distribution unit including a first electrode and a charge transport layer. The first electrode is electrically connected to the control unit, and an orthographic projection of the charge transport layer on the substrate covers the orthographic projection of the first electrode on the substrate. The charge distribution unit is configured to discharge under the control of the control unit. In the embodiments of the present disclosure, a plurality of sub-pixels arranged in an array are provided in the detection baseboard, each sub-pixel includes a control unit and a charge distribution unit that are electrically connected to each other. In each sub-pixel, the control unit may control the charge distribution unit to discharge. In this way, the control units of some sub-pixels may be set to control the charge distribution units of these sub-pixels to discharge, and the control units of some sub-pixels may be set to control the charge distribution units of these sub-pixels not to discharge, thereby forming a charge pattern and realizing the control of charge patterns by electrical signals. By providing a new method of electrostatic imaging, the problem of low exposure accuracy caused by interference from the external light, when forming the charge pattern by controlling the light source exposure in related art, is avoided.

Exemplary embodiments will now be described thoroughly with reference to the accompanying drawings.

Figure 9:
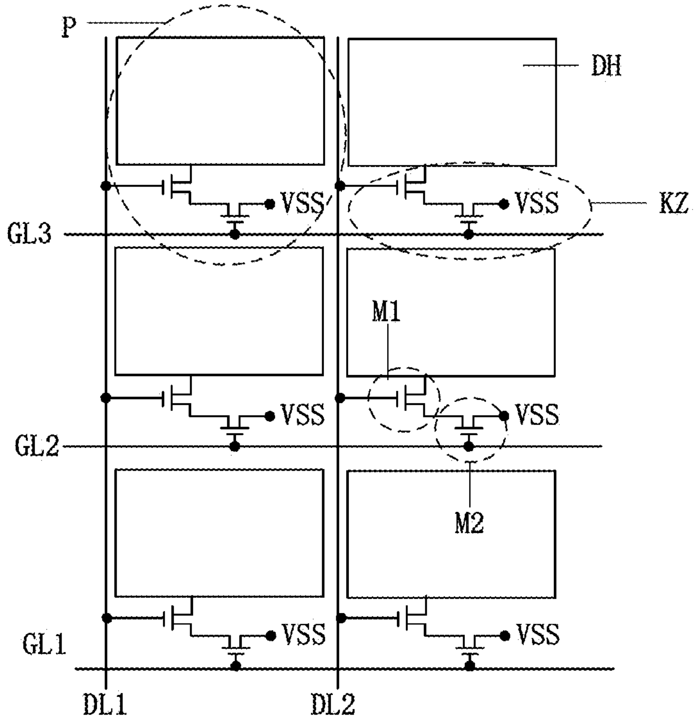
FIG. 9 to FIG. 11 are schematic diagrams illustrating circuits of three types of detection baseboards provided by embodiments of the present disclosure.
Figure 10:
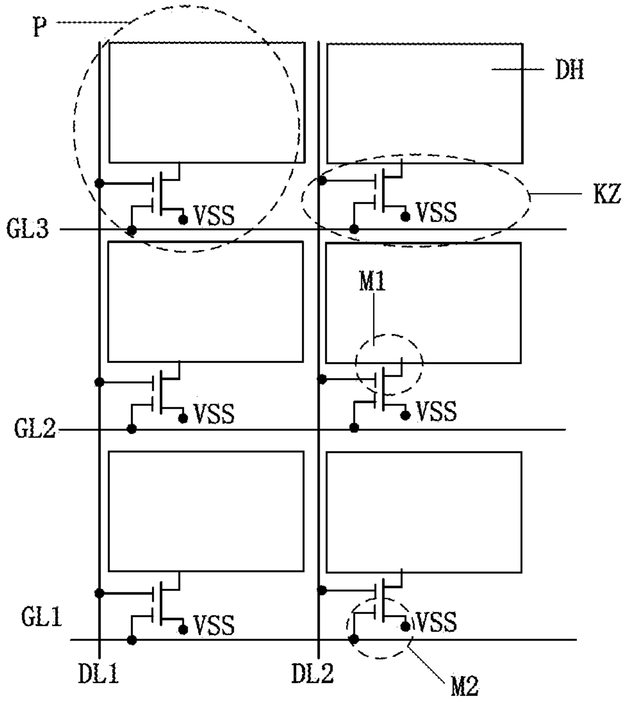
Figure 11:
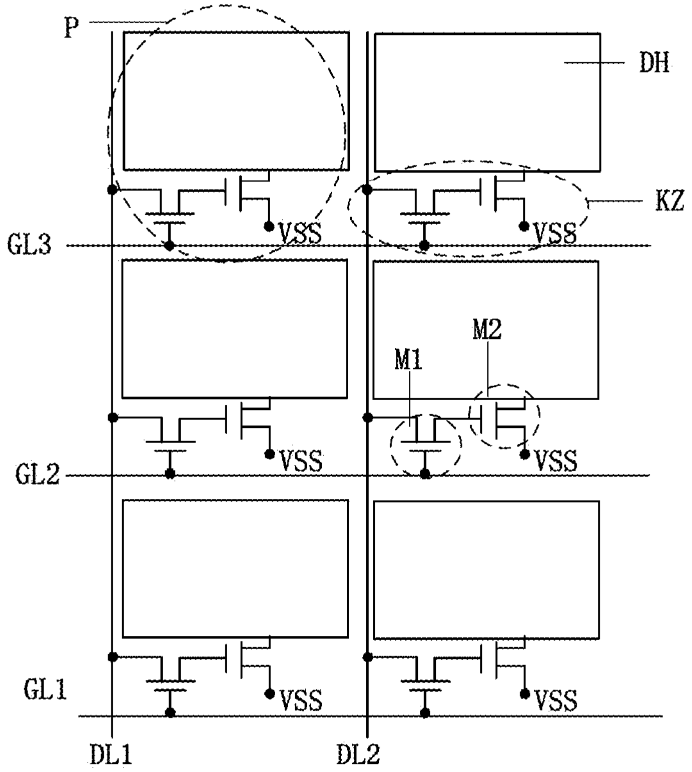

An embodiment of the present disclosure provides a detection baseboard, including:

- a substrate 1;
- a plurality of data lines DL extending in a first direction and a plurality of gate lines GL extending in a second direction on the substrate 1, as shown in FIG. 9, FIG. 10 and FIG. 11, the first direction intersecting with the second direction; and
- a plurality of sub-pixels P arranged in an array, the sub-pixels P being located at positions defined by the data lines DL and the gate lines GL, and the sub-pixels P being electrically connected to the data lines DL and the gate hues GL respectively.

As shown in FIG. 3 to FIG. 6, each sub-pixel P includes a control unit KZ and a charge distribution unit DH. The control unit KZ is electrically connected to the data line DL and the gate line GL respectively. The charge distribution unit DH includes a first electrode 9 and a charge transport layer 10. The first electrode 9 is electrically connected to the control unit KZ. An orthographic projection of the charge transport layer 10 on the substrate 1 covers the orthographic projection of the first electrode 9 on the substrate 1. The charge distribution unit DH is configured to discharge under the control of the control unit KZ.

The specific material of the substrate 1 is not limited here. In some embodiments, the material of the substrate 1 may be a rigid material, for example, the ordinary optical glass, the silicon material. The substrate made from the silicon material may be a P-type monocrystal silicon substrate, or an N-type monocrystal silicon substrate, which can be specifically determined according to actual products.

In some embodiments, the material of the substrate 1 may be a flexible material, such as ultra-thin glass, polyimide (PI), polyethylene terephthalate (PET), or a surface-treated polymer soft film. When the substrate 1 is a flexible substrate, it may include a single layer of flexible material; or, the substrate 1 may include a first flexible material layer, a first inorganic non-metallic material layer, and a second flexible material layer that are stacked in sequence. The first flexible material layer and the second flexible material layer are made of materials such as polyimide (PI), polyethylene terephthalate (PET) or surface-treated polymer soft film. The material of the first inorganic non-metallic material layer is silicon nitride (SiNx) with a single-layer structure, silicon oxide (SiOx) with a single-layer structure, or a stacked structure of silicon nitride and silicon oxide, which is used to improve the water and oxygen resistance performance of the detection baseboard, thereby increasing the service life of the detection baseboard.

The specific number of data lines DL and gate lines GL is not limited here, and is related to the size of the detection baseboard and the pixel distribution density (PPI) of the sub-pixels, and can be determined according to the design of actual products.

A specific angle formed by the intersection of the first direction and the second direction is not limited here.

For example, the first direction may be a vertical direction, the second direction may be a horizontal direction, and the first direction is perpendicular to the second direction.

For example, the angle formed by the intersection of the first direction and the second direction may also be an acute angle.

The specific materials of the gate lines GL and data lines DL are not limited here.

For example, the material of the gate line GL may include molybdenum, copper, aluminum and the like. For example, a laminated structure of Mo/Al/Mo may be formed by sputtering. In the laminated structure, the material on a side close to the substrate is Mo with a thickness of about 200 Å, which is mainly used to improve the adhesion between film layers; the material of the intermediate layer of the stacked structure is Al, which is the material of the electrical signal transmission channel; the material on a side facing away from the substrate 1 is Mo with a thickness of about 800 Å, which is used to protect the intermediate layer and prevent the surface of the intermediate layer with low resistivity from being exposed and oxidized. For example, a laminated structure of MoNb/Cu/MoNb may also be formed by sputtering. In the laminated structure, the material on the side close to the substrate is MoNb with a thickness of about 300 Å, which is mainly used to improve the adhesion between film layers: the material of the intermediate layer of the laminated structure is Cu, which is the material of the electrical signal transmission channel; the material on the side facing away from the substrate 1 is MoNb with a thickness of about 200 Å, which may be used to protect the intermediate layer and prevent the surface of the intermediate layer with low resistivity from being exposed and oxidized. Since the thickness obtained through a single sputtering generally does not exceed 1 μm, multiple times of sputtering are required to form a gate line GL with a thickness exceeding 1 μm. Alternatively, it can also be formed by electroplating. Specifically, a seed layer, such as Cu or Ag, can be formed first (Ti or similar alloy materials can be pre-deposited as an adhesion layer of the seed layer), and then copper with low resistivity is prepared by electroplating, then an anti-oxidation layer is prepared.

As an example, the material of the data line DL may be the same as the material of the gate line GL.

The shape of the orthographic projection of the sub-pixel P on the substrate 1 is not limited here. For example, the shape of the orthographic projection of the sub-pixel P on the substrate 1 includes at least one of a polygon, an arc, and a combination of polygons and arcs, and the combination of polygons and arcs includes: a shape formed by splicing polygons and arcs, or a shape obtained by digging out local regions on polygons or arcs.

In some embodiments, shapes of the orthographic projections of the sub-pixels P on the substrate 1 may be set to be the same.

In some embodiments, the plurality of sub-pixels P may include a first sub-pixel, a second sub-pixel and a third sub-pixel, and the shapes of the orthographic projections of the first sub-pixel, the second sub-pixel and the third sub-pixel on the substrate 1 are different.

The control unit KZ includes a pixel circuit through which the charge distribution unit DH is controlled to discharge, and the pixel circuit includes a plurality of electrical devices, such as transistors. The specific electrical devices included in the control unit KZ and the electrical connections between the electrical devices are not limited here as long as the control unit KZ can control the charge distribution unit DH to discharge.

The material of the first electrode 9 in the charge distribution unit DH is not limited here. As an example, the first electrode 9 may be made of a metal material, for example, any one or more of magnesium (Mg), silver (Ag), copper (Cu), aluminum (Al), titanium (Ti) and molybdenum (Mo); or an alloy material of the above metals, for example, aluminum-neodymium alloy (AlNd) or molybdenum-niobium alloy (MoNb), which may be a single-layer structure, or a multi-layer structure, such as Ti/Al/Ti, etc.; or a transparent conductive material, for example, ITO, IZO; or, a stacked structure formed by metal and transparent conductive materials, for example, ITO/Ag/ITO, Mo/AlNd/ITO and other materials.

In some embodiments, the charge transport layer 10 may include a hole transport layer. In some other embodiments, the charge transport layer 10 may include an electron transport layer.

The orthographic projection of the charge transport layer 10 on the substrate 1 covers the orthographic projection of the first electrode 9 on the substrate 1 means that in the same sub-pixel, the orthographic projection of the first electrode 9 on the substrate 1 is located within the orthographic projection of the charge transport layer 10 on the substrate 1, including but not limited to: an outer contour of the orthographic projection of the first electrode 9 on the substrate 1 is located within an outer contour of the orthographic projection of the charge transport layer 10 on the substrate 1, in this case, the area of the orthographic projection of the charge transport layer 10 on the substrate 1 is greater than the area of the orthographic projection of the first electrode 9 on the substrate 1; or the outer contour of the orthographic projection of the first electrode 9 on the substrate 1 overlaps with the outer contour of the orthographic projection of the charge transport layer 10 on the substrate 1, in this case, the area of the orthographic projection of the charge transport layer 10 on the substrate 1 is equal to the area of the orthographic projection of the first electrode 9 on the substrate 1.

In the embodiment of the present disclosure, the detection baseboard is provided with a plurality of sub-pixels P arranged in an array, each of the sub-pixels P includes a control unit KZ and a charge distribution unit DH electrically connected to each other. In each sub-pixel P, the control unit KZ is configured to control the charge distribution unit DH to discharge. In this way, control units KZ of some sub-pixels may be configured to control the charge distribution units DH to discharge, and control units KZ of some sub-pixels may be configured to control the charge distribution units DH not to discharge, thereby forming a charge pattern and realizing the control of the charge pattern through the electrical signals. By providing a new method of electrostatic imaging, the problem of low exposure accuracy caused by interference from the external light, when forming the charge pattern by controlling the light source exposure in related art, is avoided, and the accuracy of forming the charge pattern is improved. When the detection baseboard is applied to a printing device, the printing accuracy and printing clarity can be improved, avoiding printing blur caused by interference from the external light during the exposure process. In addition, in the printing device, the light-shielding component in the related art can also be omitted, thereby simplifying the design of the printing device and reducing the cost.

In a detection baseboard provided by an embodiment of the present disclosure, as shown in FIG. 9 to FIG. 11, the detection baseboard also includes a first signal line (e.g., a VSS line) electrically connected to the control unit KZ. When the charge distribution unit DH is in a full charge state, the voltage of the signal transmitted in the first signal line is less than the voltage of the first electrode 9. The first signal line is configured to transmit a signal with a constant voltage, and the charge distribution unit DH is configured to discharge, under the control of the control unit, to the first signal line along the control unit KZ.

For example, the full charge state of the charge distribution unit DH includes two situations: the charge distribution unit DH is in a state of being fully charged with positive charges; or, the charge distribution unit DH is in a state of being fully charged with negative charges.

It should be noted that, the full charge state of the charge distribution unit DH refers to a state where the detection baseboard has been charged.

For example, a charging roller may be energized with a high voltage power supply, and the charging roller is made to be in contact with the surface of the charge transport layer 10 of the detection baseboard so that the surface of the charge transport layer 10 of the detection baseboard is uniformly carried with charges (positive charges or negative charges). The polarity of the charges on the surface of the charge transport layer 10 is the same as the polarity of the voltage energizing the charging roller. For the specific charging process of the detection baseboard, please refer to the charging process of the printer in related art, which will not be introduced in detail here.

In a detection baseboard provided by an embodiment of the present disclosure, the first signal line includes a ground line GND or a negative power supply signal line VSS.

In the embodiment of the present disclosure, the control unit KZ is configured to control the conduction between the charge distribution unit DH and the first signal line. When the charge distribution unit DH is electrically connected to the first signal line, the charge distribution unit DH may discharge to the first signal line along the control unit KZ, so that the charges on the surface of the charge transport layer 10 of the charge distribution unit DH disappear (for example, in the sub-pixel P2 in FIG. 5, negative charges are transferred in the direction indicated by the dotted arrow to be neutralized with positive charges, so that the positive charges on the surface of the charge transport layer 10 gradually disappear), causing the surface of the charge transport layer 10 of some sub-pixels to carry no charge, and forming a charge pattern. In this way, the charge pattern is controlled according to the electrical signal, that is, a new electrostatic imaging method is provided, which avoids the problem of low exposure accuracy caused by interference from the external light, when forming the charge pattern by controlling the light source exposure in related art. The accuracy of forming the charge pattern is improved. When the detection baseboard is applied to a printing device, the printing accuracy and printing clarity can be improved, avoiding printing blur caused by interference from the external light during the exposure process. In addition, in the printing device, the light-shielding component in the related art can also be omitted, thereby simplifying the design of the printing device and reducing the cost.

In a detection baseboard provided by an embodiment of the present disclosure, the control unit KZ includes at least two transistors, one of which is electrically connected to the data line DL, and the other transistor is electrically connected to the first signal line (e.g., VSS).

The specific types of the above-mentioned transistors are not limited here.

As an example, the above-mentioned transistors may be thin film transistors (TFT); or, the above-mentioned transistors may be metal oxide semiconductor field effect transistors (MOSFET).

For example, the above-mentioned transistors may all be N-type transistors; or, the above-mentioned transistors may all be P-type transistors, which may be determined according to the actual situation.

Figure 7:
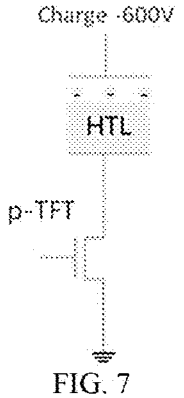
FIG. 7 and FIG. 8 are diagrams illustrating charging two types of detection baseboards provided by embodiments of the present disclosure.
Figure 8:
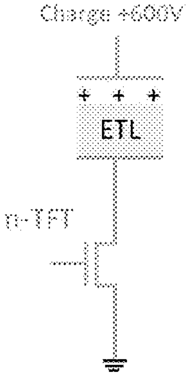

It should be noted that, as shown in FIG. 7, in the case that each transistor in the control unit KZ is a P-type transistor, the charging roller is negatively charged and brought into contact with the surface of the charge transport layer 10, so that the surface of the charge transport layer 10 is carried with negative charges; as shown in FIG. 8, in the case that each transistor in the control unit KZ is an N-type transistor, the charging roller is positively charged and brought into contact with the surface of the charge transport layer 10, so that the surface of the charge transport layer 10 is carried with positive charges.

Hereinafter, three types of control units KZ with different structures are provided, and the electrical connection methods and working principles of the components in each control unit KZ are explained.

As shown in FIG. 9, the first type of control unit KZ includes a first transistor M1 and a second transistor M2; the gate of the first transistor M1 is electrically connected to the data line DL (for example, DL1 or DL2), a first terminal of the first transistor M1 is electrically connected to the first electrode 9, a second terminal of the first transistor M1 is electrically connected to a first terminal of the second transistor M2; the gate of the second transistor M2 is electrically connected to the gate line GL (for example, GL1 or GL2), the second terminal of the second transistor M2 is electrically connected to the first signal line (for example, VSS).

The detection baseboard may also include: a gate drive circuit that is electrically connected to the gate lines GL and configured to control the gate lines GL to scan each row of sub-pixels P row-by-row; and a driving chip that is electrically connected to the data lines DL and configured to provide control signals to the data lines DL.

In the detection baseboard as shown in FIG. 9, the electrical signal provided by the gate line GL controls whether to turn on the first transistor M1, the electrical signal provided by the data line DL controls whether to turn on the second transistor M2. When the first transistor M1 is controlled to be turned on based on the electrical signal provided by the gate line GL, and the second transistor M2 is controlled to be turned on based on the electrical signal provided by the line DL, the control unit KZ makes the charge distribution unit DH to connect to the first signal line (e.g., VSS), so that the charge distribution unit DH discharges to the first signal line (e.g., VSS), causing the charges on the surface of the charge distribution unit DH to disappear. When at least one of the first transistor M1 and the second transistor M2 is not turned on, the connection between the charge distribution unit DH and the first signal line (e.g., VSS) breaks, so that the charge distribution unit DH cannot discharge, and the charge distribution unit DH holds charges thereof. In this way, the charge pattern is formed by controlling electrical signals.

As shown in FIG. 10, the second type of control unit KZ includes a first transistor M1 and a second transistor M2; the gate of the first transistor M1 is electrically connected to the data line DL, a first terminal of the first transistor M1 is electrically connected to the first electrode 9, a second terminal of the first transistor M1 is shared with a first terminal of the second transistor M2; the gate of the second transistor M2 is electrically connected to the gate line GL, the second terminal of the second transistor M2 is electrically connected to the first signal line (for example, VSS). The configuration and electrical connection of the components in the second type of control unit KZ are similar to that of the first type of control unit, and the working principle of the second type of control unit KZ is also the same as the first type of control unit, which will not be repeated here.

It should be noted, in the second type of control unit KZ, the second terminal of the first transistor M1 is configured to be shared with the first terminal of the second transistor M2. In this way, during the process of forming the charge pattern on the detection baseboard, since the second terminal of the first transistor M1 is shared with the first terminal of the second transistor M2, the discharge path between the charge distribution unit DH and the first signal line is shortened to a great extent, thereby increasing the discharge rate of the charge distribution unit DH and reducing the time for forming the charge pattern. When the detection baseboard is applied in a printing device, the printing time can be greatly reduced and the user experience can be improved.

As shown in FIG. 11, the third type of control unit includes a first transistor M1 and a second transistor M2, the gate of the first transistor M1 is electrically connected to the gate line GL, and a first terminal of the first transistor M1 is electrically connected to the data line DL, a second terminal of the first transistor M1 is electrically connected to the gate of the second transistor M2; a first terminal of the second transistor M2 is electrically connected to the first electrode 9, and a second terminal of the second transistor M2 is electrically connected to the first signal line (e.g., VSS).

The detection baseboard may also include: a gate drive circuit that is electrically connected to the gate lines GL and configured to control the gate lines GL to scan each row of sub-pixels P row-by-row; and a driving chip that is electrically connected to the data lines DL and configured to provide control signals to the data lines DL.

In the detection baseboard as shown in FIG. 11, the electrical signal provided by the gate line GL is used for controlling whether to turn on the first transistor M1, and when the first transistor M1 is turned on, the electrical signal provided by the data line DL is used for controlling whether to turn on the second transistor M2. When the first transistor M1 is controlled to be turned on based on the electrical signal provided by the gate line GL, the electrical signal provided by the data line DL is transmitted to the gate of the second transistor M2 through the first transistor M1, and the second transistor M2 is controlled to be turned on, the control unit KZ connects the charge distribution unit DH to the first signal line (e.g., VSS), thereby enabling the charge distribution unit DH to discharge through the first signal line (e.g., VSS), causing the charges on the surface of the charge distribution unit DH to disappear. When at least one of the first transistor M1 and the second transistor M2 is not turned on, the connection between the charge distribution unit DH and the first signal line (e.g., VSS) breaks, so that the charge distribution unit DH cannot discharge, and the charge distribution unit DH holds charges thereof. In this way, the charge pattern is formed by controlling electrical signals.

In the detection baseboard provided in the embodiment of the present disclosure, by configuring the control unit KZ as one of the three types of control units described above, the charge pattern is formed merely by controlling electrical signals, that is, a new electrostatic imaging method is provided, which avoids the problem of low exposure accuracy caused by interference from the external light and a low service life of a light source (a laser), when forming the charge pattern by controlling the light source exposure in related art. The accuracy of forming the charge pattern is improved. When the detection baseboard is applied to a printing device, the printing accuracy and printing clarity can be improved, avoiding printing blur caused by interference from external light during the exposure process. In addition, in the printing device, the light-shielding component in the related art can also be omitted, thereby simplifying the design of the printing device and reducing the cost. The above control unit KZ is simple in design and easy to implement.

In a detection baseboard provided by an embodiment of the present disclosure, the charge distribution unit DH also includes a buffer layer and a charge injection layer. The buffer layer is located between the first electrode and the charge transport layer. The charge injection layer is located between the buffer layer and the charge transport layer. The polarity of the charges injected by the charge injection layer is the same as that of the charges transported by the charge transport layer.

The charge injection layer may include a hole injection layer (HIL) and an electron injection layer (EIL).

When the charge transport layer includes a hole transport layer, the charge injection layer may include a hole injection layer; when the charge transport layer includes an electron transport layer, the charge injection layer may include an electron injection layer.

As an example, the material of the hole injection layer may include oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide.

As an example, the material of the hole injection layer may also include organic materials such as hexacyano-hexaazatriphenylene, 2, 3, 5, 6-tetrafluoro-7, 7, 8, 8-tetra-cyano p-quinodimethane (F4TCNQ), 1, 2, 3-tris[(cyano)(4-cyano-2, 3, 5, 6-tetrafluorophenyl) methylene]cyclopropane.

As an example, the material of the electron injection layer may be alkali metals/metals and a compound thereof, such as lithium fluoride (LiF), ytterbium (Yb), magnesium (Mg), and calcium (Ca).

In the embodiment of the present disclosure, by providing a charge injection layer in the charge distribution unit DH, the charge transport rate can be further increased, and the discharge rate can be increased, thereby shortening the time for forming the charge pattern.

In a detection baseboard provided by an embodiment of the present disclosure, as shown in FIG. 7, the charge transport layer 10 includes a hole transport layer (HTL), and each transistor in the control unit KZ is a P-type transistor.

Among them, the N-type transistor transfers a high level, and the P-type transistor transfers a low level.

When the charge transport layer 10 includes the hole transport layer (HTL) and each transistor in the control unit KZ is a P-type transistor, as shown in FIG. 7, the charging roller is negatively charged and brought into contact with the surface of the charge transport layer 10, so that the surface of the charge transport layer 10 is carried with negative charges. The electrostatic potential at the surface of the charge transport layer is −600V. In the process of forming the charge pattern by discharging to the first signal line by the charge distribution unit DH, positive charges (holes) are transported to the surface of the charge distribution unit DH, so that the negative charges (electrons) and positive charges (holes) are neutralized, causing the charges on the surface of the charge distribution unit DH to disappear. In the case of transporting positive charges (holes) to the surface of the charge distribution unit DH, the charge transport layer of the charge distribution unit DH may include a hole transport layer (a film layer with hole transport properties) so that the holes can be smoothly transported to the surface of the charge distribution unit DH.

As an example, the material of the hole transport layer (HTL) may include aromatic amines, hydrazones, imidazoles, thiazoles, oxadiazoles, butadiene compounds and dimethylfluorene or carbazole materials with hole transport properties, for example, poly-vinylcarbazole (PVK) 4, 4'-bis [N-(1-naphthyl)-N-phenylamino]biphenyl (NPB), N, N'-bis (3-methylphenyl)-N, N'-diphenyl-[1,1'-biphenyl]-4, 4'-diamine (TPD), 4-Phenyl-4'-(9-phenylfluoren-9-yl) triphenylamine (BAFLP), 4, 4'-bis[N-(9,9-dimethylfluoren-2-yl)-N-phenylamino]biphenyl (DFLDPBi), 4, 4'-Bis(9-carbazolyl)biphenyl (CBP), 9-phenyl-3-[4-(10-phenyl-9-anthacenyl)phenyl]-9H-carbazole (PCzPA).

In a detection baseboard provided by an embodiment of the present disclosure, as shown in FIG. 8, the charge transport layer 10 includes an electron transport layer (ETL), and each transistor in the control unit KZ is an N-type transistor.

In the case that the charge transport layer 10 includes an electron transport layer (ETL), and each transistor in the control unit KZ is an N-type transistor, as shown in FIG. 8, the charging roller is positively charged and brought into contact with the surface of the charge transport layer 10, so that the surface of the charge transport layer 10 is carried with positive charges. The electrostatic potential at the surface of the charge transport layer is +600V. In the process of forming the charge pattern by discharging to the first signal line by the charge distribution unit DH, negative charges (electrons) are transported to the surface of the charge distribution unit DH, so that the negative charges (electrons) and positive charges (holes) are neutralized, causing the charges on the surface of the charge distribution unit DH to disappear. In the case of transporting negative charges (electrons) to the surface of the charge distribution unit DH, the charge transport layer of the charge distribution unit DH may include an electrons transport layer (a film layer with electron transport properties) so that the electrons can be smoothly transported to the surface of the charge distribution unit DH.

As an example, the material of the electron transport layer (ETL) may include aromatic heterocyclic compounds, such as benzimidazole derivatives, imidazole derivatives, pyrimidine derivatives, oxazine derivatives, quinoline derivatives, isoquinoline derivatives, phenanthroline derivatives and the like. The material of the electron transport layer (ETL) may also include polynitro compounds (for example 2,4,7-trinitrofluorenone. TNF), cyano compounds, anhydride derivatives of naphthalene, quinone compounds, or inorganic ZnO, IGZO, TiO2, $SnO_2$, etc.

In a detection baseboard provided by an embodiment of the present disclosure, as shown in FIG. 3 to FIG. 6, FIG. 16 and FIG. 17, the detection baseboard includes a first conductive layer 2, a semiconductor layer 4 and a second conductive layer 5.

The first conductive layer 2 is located on a side of the substrate 1, and includes the gate lines GL and a gate electrode gt of each transistor.

The semiconductor layer 4 is located on a side of the first conductive layer 2 facing away from the substrate 1 and is insulated from the first conductive layer 2. The semiconductor layer 4 includes an active region 41 of each transistor.

The second conductive layer 5 is located on a side of the semiconductor layer 4 facing away from the substrate 1, and includes the data lines DL and a source s and a drain d of each transistor. The orthographic projection, on the substrate 1, of the gate gt of at least one transistor in the control unit KZ is partially overlaps with the orthographic projection of the active region 41 on the substrate 1.

The material of the semiconductor layer 4 is not limited here. In some embodiments, the material of the semiconductor layer 4 may include amorphous silicon (a-Si). In some other embodiments, the material of the semiconductor layer 4 may include low-temperature polysilicon (LTPS). In some other embodiments, the material of the semiconductor layer 4 may include metal oxide, such as indium gallium zinc oxide (IGZO).

Figure 12:
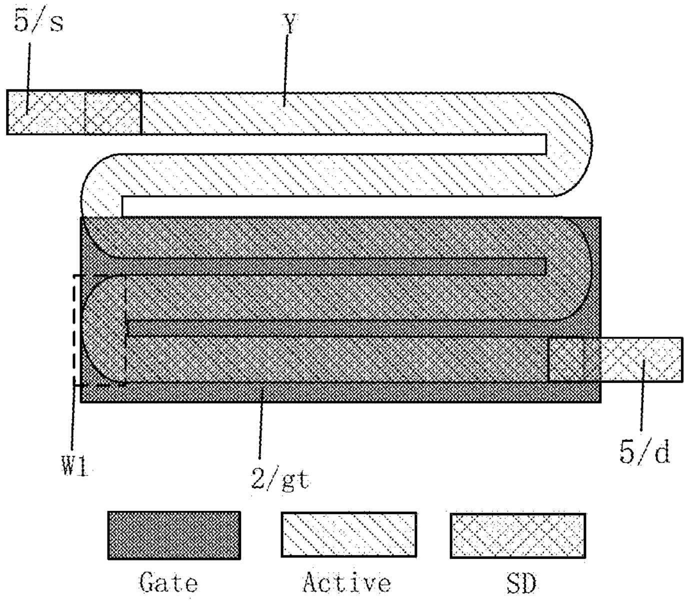
FIG. 12 to FIG. 15 are schematic structural diagrams illustrating four types of transistors provided by embodiments of the present disclosure.
Figure 13:
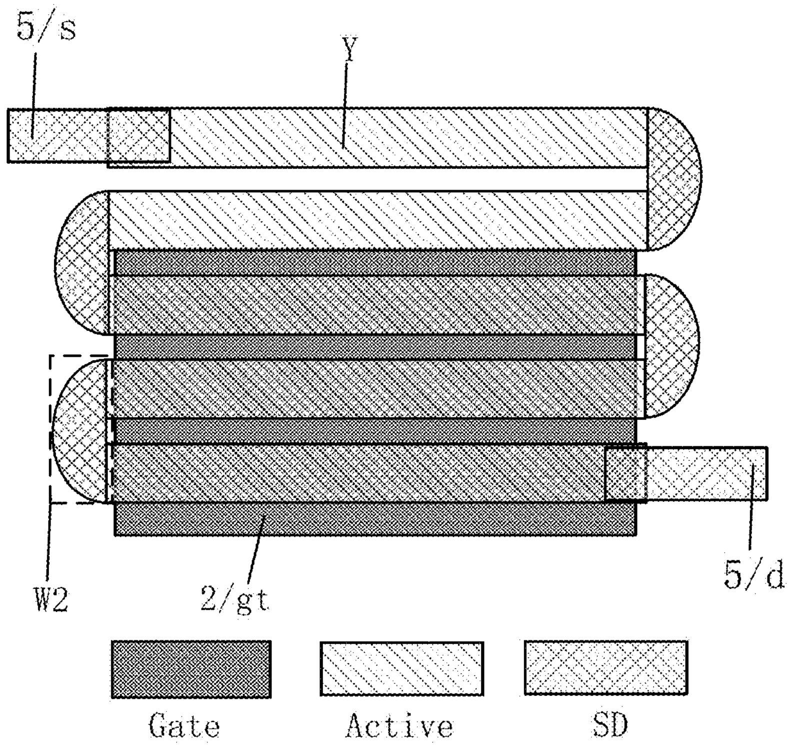

The first conductive layer 2 may also be called as a gate layer, and the second conductive layer 5 may also be called as a source-drain metal layer. The materials of the first conductive layer 2 and the second conductive layer 5 include conductive materials, such as metal copper. In FIG. 12 and FIG. 13, the film layer marked Gate is the gate layer, the film layer marked Active is the semiconductor layer 4, and the film layer marked SD is the source-drain metal layer.

In some embodiments, as shown in FIG. 3 to FIG. 6, the semiconductor layer 4 includes the active region 41 of each transistor, a contact region 42 and a contact region 43 located on two sides of the active region 41, the semiconductor layer 4 being in direct contact with the first the second conductive layers 5, the contact region 42 being in contact with and connecting with the source electrode 5/*s*, and the contact region 43 being in contact with and connecting with the drain electrode 5/*d*.

Figure 16:
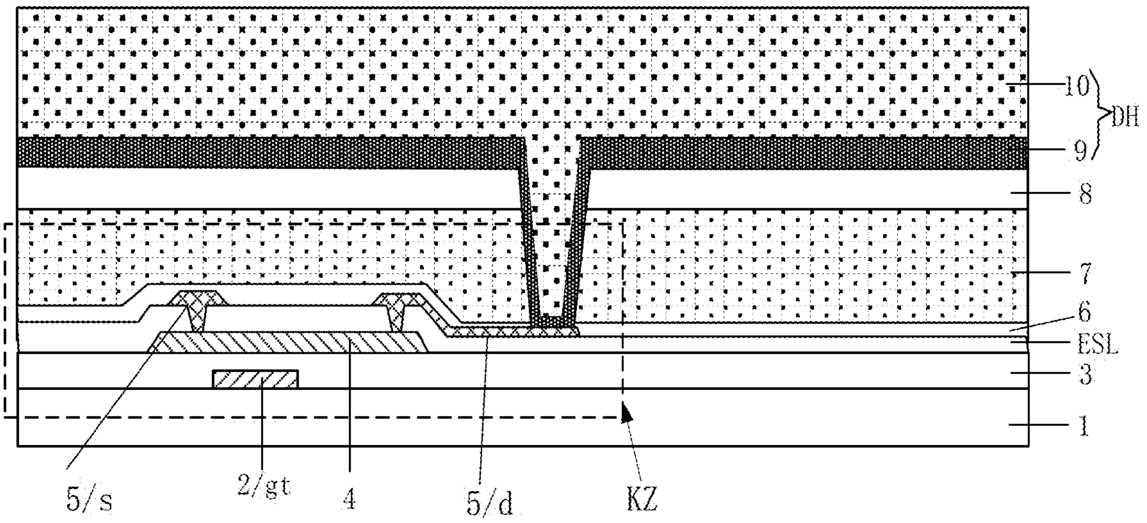
FIG. 16 and FIG. 17 are schematic structural diagrams illustrating another two types of detection baseboards provided by embodiments of the present disclosure.

In some embodiments, as shown in FIG. 16, the semiconductor layer 4 includes the active region 41 of each transistor, a contact region 42 and a contact region 43 located on two sides of the active region 41, and an etch stop layer (ESL) is also provided between the semiconductor layer 4 and the second conductive layer 5, the contact region 42 and the source electrode 5/*s* are connected via a through hole, and the contact region 43 and the drain electrode 5/*d* are connected via a through hole.

The orthographic projection, on the substrate 1, of the gate gt of at least one transistor in the control unit KZ partially overlaps with the orthographic projection of the active region 41 on the substrate 1, and the orthographic projection, on the substrate 1, of the gate gt of the at least one transistor does not overlap with the orthographic projection of the active region 41 on the substrate 1. The part of the active region 4 whose orthographic projection on the substrate 1 does not overlap with the gate gt can greatly improve the high voltage resistance characteristics of the transistor, and such design is called Offset design.

Since the energization voltage of the charging roller is usually high, when the detection baseboard is charged by the charging roller, the voltage on the charge distribution unit DH of the detection baseboard is also high. Thus, during a process in which the charge distribution unit DH discharges to the first signal line, the transistors in the control unit KZ need to withstand higher voltages. In order to avoid the failure of the transistors in the control unit KZ and extend the service life of the transistors in the control unit KZ, the above design is adopted, through which this problem can be significantly improved, thereby improving the electrical stability of the control unit KZ and extending the service life of the detection baseboard.

In a detection baseboard provided by an embodiment of the present disclosure, as shown in FIG. 12, in the first transistor M1, the orthographic projection of the gate gt on the substrate 1 partially overlaps with the orthographic projection of the active region 41 on the substrate 1.

The active region 41 of the first transistor M1 includes a plurality of active parts Y and first bending parts W1 connecting two adjacent active parts Y, the orthographic projection of some of the first bending parts W1 on substrate 1 is located within the orthographic projection of the gate gt on the substrate 1.

For example, the number of the first bending parts W1 is less than the number of the active parts Y in the active region 41. Specifically, in the same transistor, the number of the first bending parts W1 is equal to 1 subtracted from the number of active parts Y. By arranging the active parts Y and the first bending parts W1 connecting two adjacent active parts Y in the active region, the aspect ratio of the transistor can be greatly increased, thereby increasing the current Id passing through the transistor.

In an exemplary embodiment, it may also set the orthographic projection of the gate gt of the second transistor M2 on the substrate 1 to partially overlap with the orthographic projection of the active region 41 on the substrate 1; the active region 41 of the second transistor M2 includes a plurality of active parts Y and a first bending part(s) W1 connecting two adjacent active parts Y. and the orthographic projection of some of the first bending parts W1 on the substrate 1 is located within the orthographic projection of the gate gt on the substrate 1.

In the embodiment of the present disclosure, on the one hand, the active region is configured to include a plurality of active parts Y and a first bending part(s) W1 connecting two adjacent active parts Y, so that the aspect ratio of the transistor can be greatly increased, thereby improving the current Id passing through the transistor, on the other hand, the orthographic projection of the some of the first bending parts W1 on the substrate 1 are arranged to be within the orthographic projection of the gate electrode gt on the substrate 1, so that the part of the active region 41 whose orthographic projection on the substrate 1 does not overlap with the gate gt can greatly improve the high voltage resistance characteristics of the transistor, thereby improving the service life of the transistor and improving the product quality of the detection baseboard.

In an exemplary embodiment, the active parts Y and the first bending parts W1 of the active region 41 form an integrated structure, so that, in the actual manufacturing process, each active part Y and each first bending part W1 can be prepared in the same preparation process by using the same material, the preparation process is less difficult and the cost is lower.

In practical applications, when the conduction of the source s and drain d of the transistor is realized under the control of the gate gt, a carrier channel is formed in the active region 41, thus the active region 41 changes from a semiconductor to a conductor, thereby causing the transistor to turn on. When the active region 41 is designed using the structure shown in FIG. 12, the active region 41 includes the active parts Y and the first bending parts W1, due to the bending structure, the migration characteristics of internal carriers of the first bending part W1 are slightly inferior to those of the active part Y. In FIG. 12, the channel region includes the active parts Y and the first bending parts W1.

Further, in a detection baseboard provided by an embodiment of the present disclosure, as shown in FIG. 13, the orthographic projection of the gate gt of the first transistor M1 on the substrate 1 partially overlaps with the orthographic projection of the active region 41 on the substrate 1; the active region 41 of the first transistor M1 includes a plurality of active parts Y; the second conductive layer (for example, SD) includes a plurality of second bending parts W2, two adjacent active parts Y are electrically connected by the second bending part W2; the orthographic projection of the second bending part W2 on the substrate 1 and the orthographic projection of the gate electrode gt on the substrate 1 do not overlap with each other.

In FIG. 12 and FIG. 13, the film layer marked Gate is the gate layer, the film layer marked Active is the semiconductor layer 4, and the film layer marked SD is the source-drain metal layer.

In the embodiment of the present disclosure, a plurality of second bending parts W2 located in the second conductive layer are arranged to electrically connect the active parts Y together, on the one hand, the second bending part W2 is a conductor per se, which can further reduce the size of the gate gt, so that the orthographic projection of the second bending part W2 on the substrate 1 and the orthographic projection of the gate gt on the substrate 1 do not overlap with each other, thereby increasing the area not overlapping with the gate among the active region 41 and the second bending part W2, and improving the transistor's high-voltage impact resistance performance; on the other hand, when the conduction of the source s and drain d of the transistor is realized under the control of the gate gt, a carrier channel is formed in the active parts Y and the second bending parts W2 of the active region 41, thus each active part Y changes from a semiconductor to a conductor, thereby causing the transistor to turn on; on the other hand, the aspect ratio of the transistor can be greatly increased to increase the current Id passing through the transistor. In FIG. 13, the channel region includes an active parts Y and the second bending parts W2.

In an exemplary embodiment, the orthographic projection of the gate gt of the second transistor M2 on the substrate 1 may also be configured to partially overlap with the orthographic projection of the active region 41 on the substrate 1; the active region 41 of the second transistor M2 includes a plurality of active parts Y, the second conductive layer (for example, SD) includes a plurality of second bending parts W2, two adjacent active parts Y are electrically connected by the second bending part W2; the orthographic projection of the second bending part W2 on the substrate 1 and the orthographic projection of the gate electrode gt on the substrate 1 do not overlap with each other.

In an exemplary embodiment, as shown in FIG. 12 and FIG. 13, the shape of the orthographic projection of each active part Y on the substrate may include a polygon, for example, a rectangle.

In a detection baseboard provided by an embodiment of the present disclosure, as shown in FIG. 12 and FIG. 13, there is a gap between two adjacent active parts Y, and the areas delineated by the orthographic projection of the gate gt on the substrate 1 and the orthographic projection of the outer contour of a part of the gaps on the substrate 1 at least partially overlap.

The areas delineated by the orthographic projection of the gate gt on the substrate 1 and the orthographic projection of the outer contour of a part of the gaps on the substrate 1 at least partially overlap, in manners including but not limited to:

1. The areas delineated by the orthographic projection of the gate gt on the substrate 1 and the orthographic projection of the outer contour of a part of the gaps on the substrate 1 partially overlap; and
2. The areas delineated by the orthographic projection of the gate gt on the substrate 1 and the orthographic projection of the outer contour of a part of the gaps on the substrate 1 completely overlap.

Figure 14:
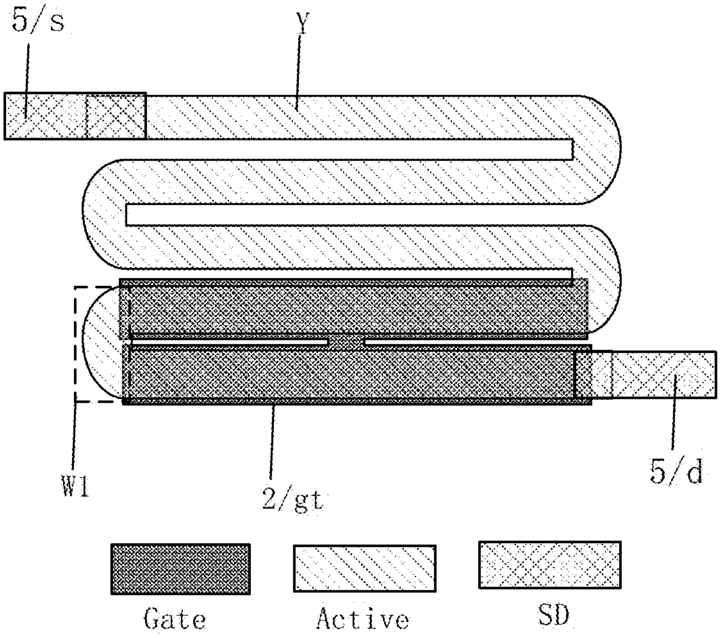
Figure 15:
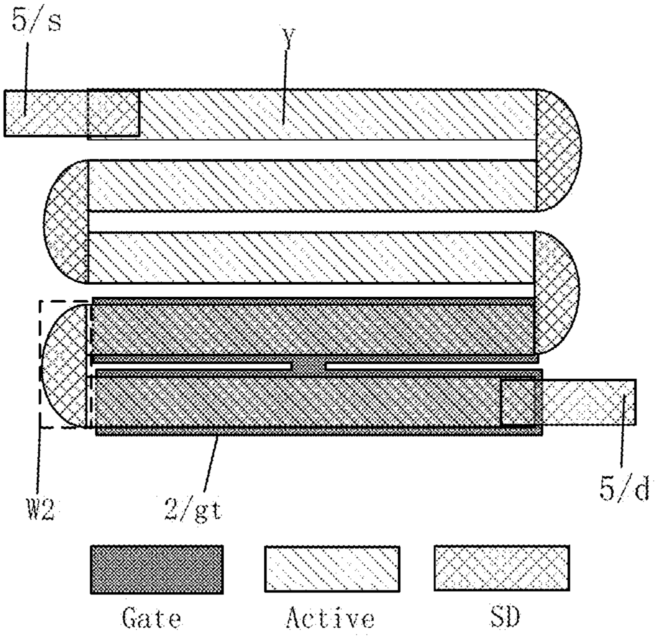

In a detection baseboard provided by an embodiment of the present disclosure, as shown in FIG. 14 and FIG. 15, the gate gt of the first transistor M1 may include a plurality of overlapping parts and at least one connecting part, and the overlapping parts are electrically connected together by the connecting part. The orthographic projection of the overlapping part on the substrate 1 overlaps with the orthographic projection of the active part Y on the substrate 1.

Figure 6:
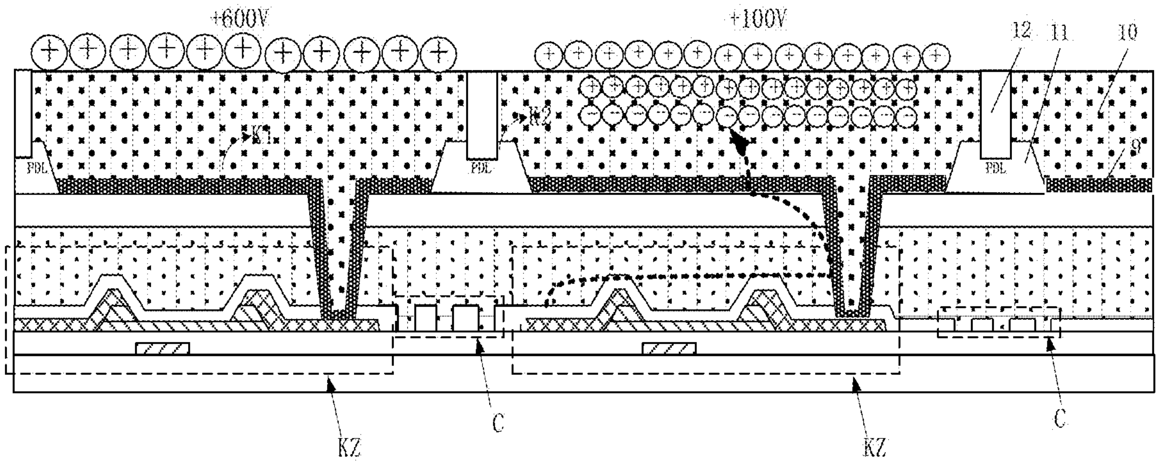

In a detection baseboard provided by an embodiment of the present disclosure, as shown in FIG. 6, the detection baseboard also includes a pixel definition layer 11 (PDL) located on a side of the first electrode 9 facing away from the substrate 1 and a plurality of pixel isolation structures 12; the charge transport layer 10 is located on a side of the pixel definition layer 11 facing away from the substrate 1; the pixel definition layer 11 includes a plurality of first openings K1 and a plurality of second openings K2, the area delineated by the orthographic projection of the first electrode 9 on the substrate 1 overlaps with the area delineated by the orthographic projection of the outer contour of the first opening K1 on the substrate 1, and the area delineated by the orthographic projection of the pixel isolation structure 12 on the substrate 1 overlaps with the area delineated by the orthographic projection of the outer contour of the second opening K2 on substrate 1; the pixel isolation structure 12 is located between two adjacent sub-pixels, and the charge transport layer 10 is configured to be disconnected at the position of the pixel isolation structure 12.

The material of the pixel definition layer 11 may include organic materials, such as polyimide, acrylic, or polyethylene terephthalate.

In an exemplary embodiment, the depth of the first opening K1 along a direction perpendicular to the thickness of the substrate 1 is less than the depth of the second opening K2 along the direction perpendicular to the thickness of the substrate 1.

For example, the first opening K1 penetrates the pixel definition layer 11, and the second opening K2 does not penetrate the pixel definition layer 11.

It should be noted that, by arranging the pixel isolation structure 12 in the second opening K2, on the one hand, the fixation stability between the pixel isolation structure 12 and the pixel definition layer 11 is better, and on the other hand, the size of the interface between the pixel isolation structure 12 and the pixel definition layer 11 is increased, so that even if there is carrier migration at the interface between the pixel isolation structure 12 and the pixel definition layer 11, due to the long propagation path, the crosstalk is difficult to occur between adjacent sub-pixels.

In the detection baseboard provided by the embodiment of the present disclosure, the area delineated by the orthographic projection of the first electrode 9 on the substrate 1 overlaps with the area delineated by the orthographic projection of the outer contour of the first opening K1 on the substrate 1, so that the first electrodes 9 of two adjacent sub-pixels are spaced apart, thereby avoiding the crosstalk between electrical signals of two adjacent first electrodes 9. Moreover, the carrier mobility of the charge transport layer is high. In order to avoid carrier migration between the charge transport layers 10 of different sub-pixels, the pixel isolation structure 12 is provided in the second opening K2 of the pixel definition layer 11, so that the pixel isolation structure 12 separates the charge transport layer 10 of adjacent sub-pixels, thereby avoiding the migration of carriers between the charge transport layers 10 of different sub-pixels. As a result, the following situation which may reduce the accuracy of forming the charge pattern is avoided: when the charge distribution unit DH in one sub-pixel discharges, the sub-pixels that originally do not need to discharge are disturbed and discharge to a certain extent.

In a detection baseboard provided by an embodiment of the present disclosure, the substrate 1 is a flexible substrate.

In a detection baseboard provided by an embodiment of the present disclosure, in a first state, the charge transport layers in various sub-pixels are located on the same plane; in a second state, the charge transport layers in various sub-pixels are located on the same curved plane, and the solid figure of the detection baseboard in the second state includes a cylinder.

When the substrate 1 of the detection baseboard is a flexible substrate, the detection baseboard may be configured as a flat structure; or, the detection baseboard may also be rolled into a shaft shape (cylinder), similar to the shape of the photosensitive drum in the related art.

In the embodiment of the present disclosure, by rolling the detection baseboard into a shaft shape, the space occupied by the detection baseboard can be reduced, so that the detection baseboard is suitable for more different products or scenarios.

Figure 4:
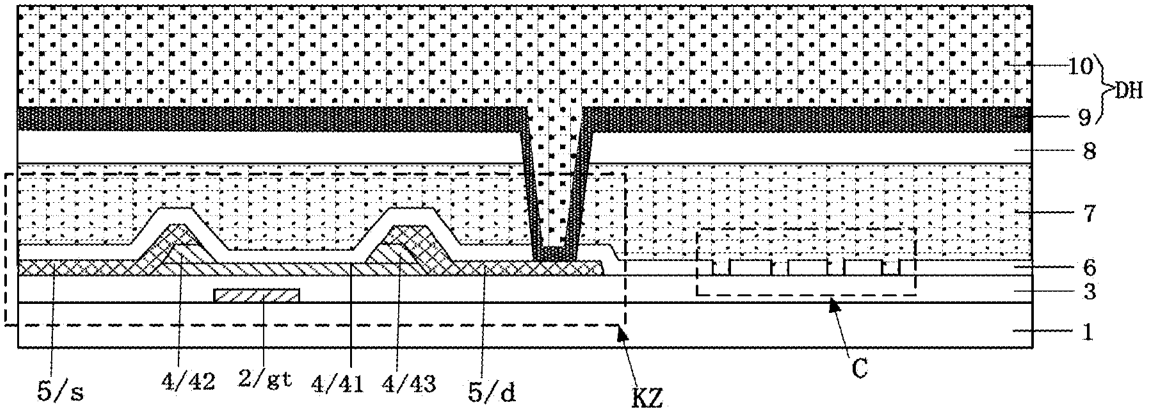
Figure 5:
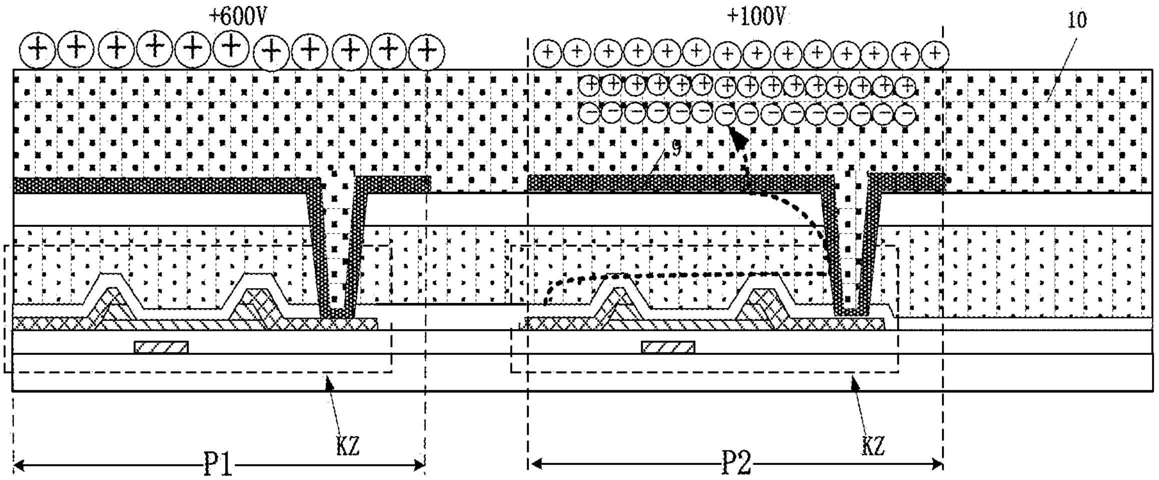
Figure 17:
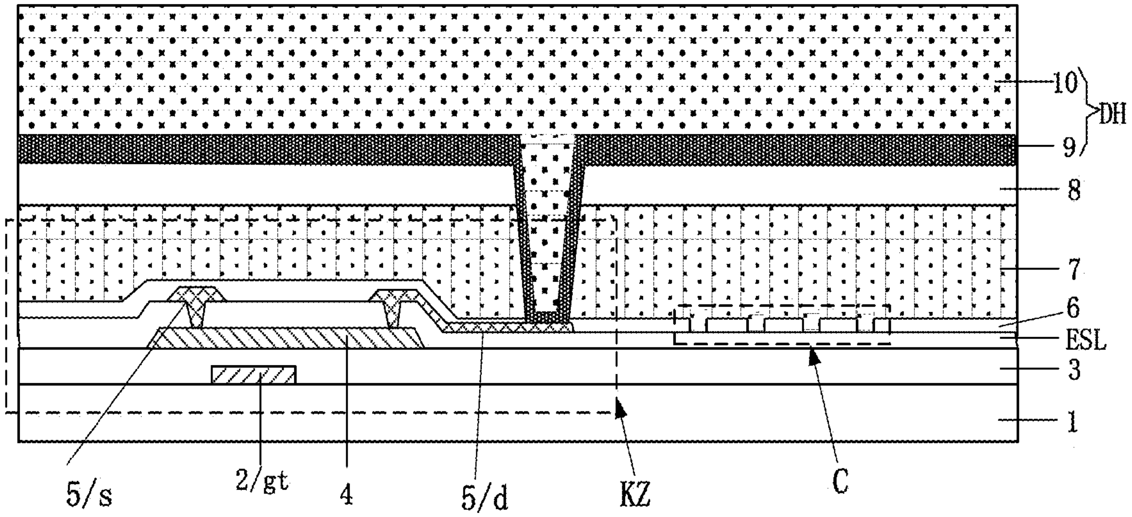

In a detection baseboard provided by an embodiment of the present disclosure, as shown in FIG. 4, FIG. 6 and FIG. 17, the detection baseboard also includes a first insulation layer 6, an organic layer 7 and a second insulation layer 8 that are stacked in sequence. The first insulation layer 6 covers various control units KZ, and the second insulation layer 8 is located on a side of each first electrode 9 close to the substrate 1. The first insulation layer 8 is provided with a plurality of grooves C in the area between two adjacent control units KZ, and the organic layer 7 extends into the grooves C.

As an example, the detection baseboard further includes a gate insulating layer 3 covering each gate electrode gt and each gate line.

As an example, the materials of the first insulation layer 6 and the second insulation layer 8 may include inorganic materials, such as at least one of silicon nitride, silicon oxide, or silicon oxynitride.

As an example, the material of the organic layer 7 may include a resin.

The depth of the groove C is not limited here. In some embodiments, as shown in FIG. 4, the groove C may penetrate the first insulation layer 8.

In the embodiment of the present disclosure, the first insulation layer 8 is provided with a plurality of grooves C in the area between two adjacent control units KZ, and the organic layer 7 extends into the grooves C. Therefore, when the detection baseboard is bent, the grooves C can effectively release the internal stress in the inorganic film layer, thereby avoiding cracks in the film layer in the detection baseboard and improving the reliability and service life of the detection baseboard.

In a detection baseboard provided by an embodiment of the present disclosure, as shown in FIG. 16, the material of the semiconductor layer 4 includes metal oxide. The detection baseboard also includes an etch stop layer (ESL) covering the semiconductor layer 4. The second conductive layer 5 is located on a side of the etch stop layer (ESL) facing away from the substrate 1.

A plurality of through holes are provided in the etch stop layer ESL, the contact region 42 and the source electrode 5/*s* are electrically connected via the through holes, and the contact region 43 and the drain electrode 5/*d* are electrically connected via the through holes.

The above-mentioned metal oxide may include indium gallium zinc oxide (IGZO). By arranging the etch stop layer ESL covering the semiconductor layer 4, the semiconductor layer 4 can be prevented from being damaged in subsequent processes such as forming the second conductive layer 5, so as to ensure the electrical stability of the transistor.

Figure 18:
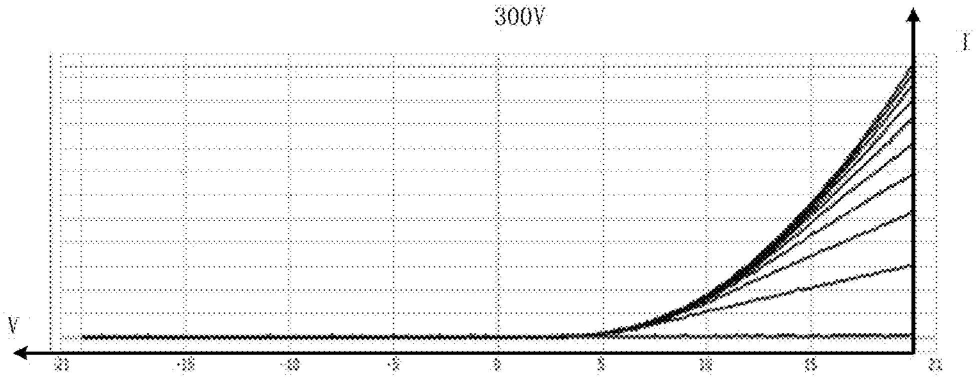
FIG. 18 and FIG. 19 are diagrams illustrating two current-voltage transfer characteristic curves of transistors provided by embodiments of the present disclosure.

FIG. 18 shows a current-voltage transfer characteristic curve (I-V curve) of a transistor provided by an embodiment of the present disclosure under the voltage of 300V. When Vds is 300V, the transistor device still has switching characteristics, and the threshold voltage Vth of the transistor approaches to 0V.

Figure 19:
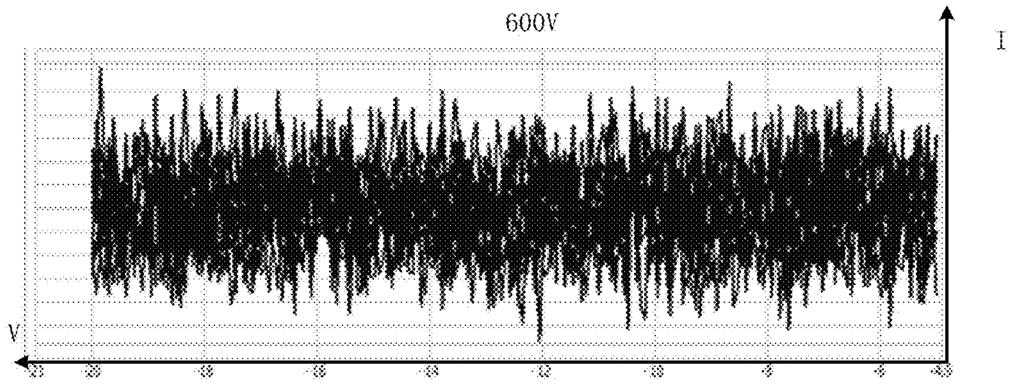

FIG. 19 shows a current-voltage transfer characteristic curve (I-V curve) of a transistor provided by an embodiment of the present disclosure under the voltage of 600V. In the off state (Vgs<Vth), when Vds is 600V, it can be seen that the leakage current value is at the noise level, which shows that when the transistor is in the off state, it is not broken down even under a high voltage of 600V, and an effective turn-off can be ensured.

As can be seen according to the data shown in FIG. 18 and FIG. 19, the transistor in the control unit KZ provided by embodiments of the present disclosure can maintain switching characteristics under high voltage, and the discharge state or holding state of the charge distribution unit DH can be effectively controlled, thereby achieving the formation of a charge pattern under the control of electrical signals. It should be noted that the high-voltage resistant voltage value of the transistor is related to the voltage value when the detection baseboard is charged. For example, the detection baseboard is charged at 600V, and the transistor provided by the embodiment of the present disclosure can maintain switching characteristics under this high voltage.

An embodiment of the present disclosure provides a detection device including the detection baseboard described above.

In the embodiment of the present disclosure, the control unit KZ is configured to control the conduction between the charge distribution unit DH and the first signal line. When there is conduction between the charge distribution unit DH and the first signal line, the charge distribution unit DH may discharge to the first signal line through the control unit KZ, so that the charges on the surface of the charge transport layer 10 of the charge distribution unit DH disappear (for example, in the sub-pixel P2 in FIG. 5, negative charges are transferred in the direction indicated by the dotted arrow to be neutralized with positive charges, so that the positive charges on the surface of the charge transport layer 10 gradually disappear), causing the surface of the charge transport layer 10 of some sub-pixels to carry no charge, and forming a charge pattern. In this way, the electrostatic charge pattern is controlled through the electrical signal, that is, a new electrostatic imaging method is provided, which avoids the problem of low exposure accuracy caused by interference from the external light, when forming the electrostatic charge pattern by controlling the light source exposure in related art.

An embodiment of the present disclosure provides a printing device including the detection baseboard described above. The printing device also includes: a charging device configured to charge the charge distribution unit of the detection baseboard; and a driving chip configured to transmit a control signal to the detection baseboard.

The charging device may include a charging roller.

In the embodiment of the present disclosure, the control unit KZ is configured to control the conduction between the charge distribution unit DH and the first signal line. When there is conduction between the charge distribution unit DH and the first signal line, the charge distribution unit DH may discharge to the first signal line through the control unit KZ, so that the charges on the surface of the charge transport layer 10 of the charge distribution unit DH disappear (for example, in the sub-pixel P2 in FIG. 5, negative charges are transferred in the direction indicated by the dotted arrow to be neutralized with positive charges, so that the positive charges on the surface of the charge transport layer 10 gradually disappear), causing the surface of the charge transport layer 10 of some sub-pixels to carry no charge, and forming a electrostatic charge pattern. In this way, the electrostatic charge pattern is controlled through the electrical signal, that is, a new electrostatic imaging method is provided, which avoids the problem of low exposure accuracy caused by interference from the external light, when forming the electrostatic charge pattern by controlling the light source exposure in related art. Accuracy in forming the electrostatic charge pattern is improved. When the detection baseboard is applied to a printing device, the printing accuracy and printing clarity can be improved, avoiding printing blur caused by interference from external light during the exposure process. In addition, in the printing device, the light-shielding component in the related art can also be omitted, thereby simplifying the design of the printing device and reducing the cost.

Figure 20:
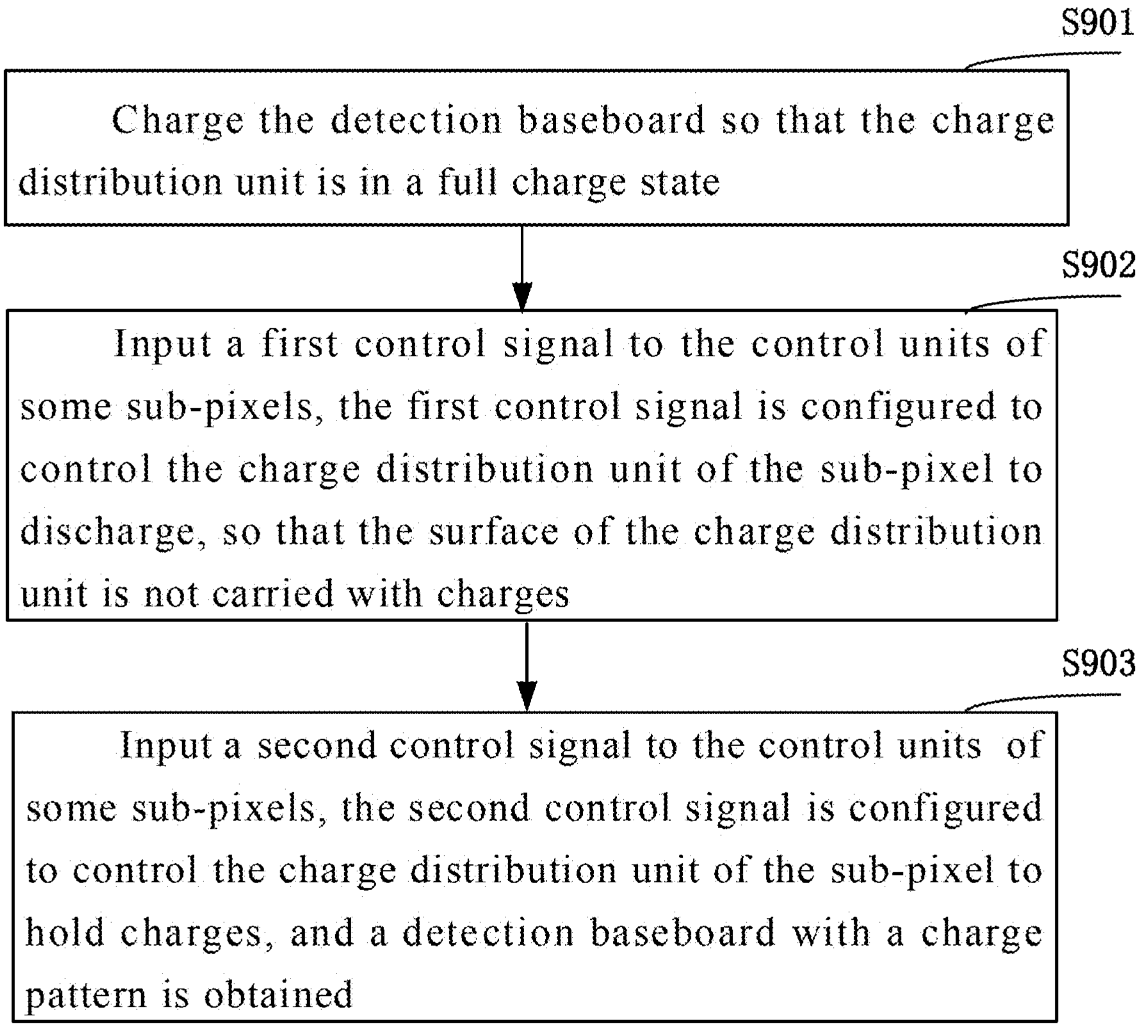
FIG. 20 is a flow chart of a method for controlling a detection baseboard provided by an embodiment of the present disclosure.

An embodiment of the present disclosure provides a method for controlling a detection baseboard, applied to the detection baseboard described above. As shown in FIG. 20, the method includes steps below.

At S901, the detection baseboard is charged, so that the charge distribution unit DH is in a full charge state.

The full charge state of the charge distribution unit DH refers to a state where the detection baseboard has been charged.

As an example, a charging roller may be energized with a high voltage power supply, and the charging roller is made to be in contact with the surface of the charge transport layer 10 of the detection baseboard so that the surface of the charge transport layer 10 of the detection baseboard is uniformly carried with charges (positive charges or negative charges). The polarity of the charges on the surface of the charge transport layer 10 is the same as the polarity of the voltage energizing the charging roller. For the specific charging process of the detection baseboard, please refer to the charging process of the printer in related art, which will not be introduced in detail here.

At S902, a first control signal is input to the control units KZ of some sub-pixels, the first control signal is configured to control the charge distribution unit DH of the sub-pixel to discharge, so that the surface of the charge distribution unit is not carried with charges.

The control unit KZ is configured to control the conduction between the charge distribution unit DH and the first signal line. When there is conduction between the charge distribution unit DH and the first signal line, the charge distribution unit DH may discharge to the first signal line along the control unit KZ, so that the charges on the surface of the charge transport layer 10 of the charge distribution unit DH disappear (for example, in the sub-pixel P2 in FIG. 5, negative charges are transferred in the direction indicated by the dotted arrow to be neutralized with positive charges, so that the positive charges on the surface of the charge transport layer 10 gradually disappear), causing the surface of the charge transport layer 10 of some sub-pixels to carry no charge.

At S903, a second control signal is input to the control units KZ of some sub-pixels, the second control signal is configured to control the charge distribution unit DH of the sub-pixel to hold charges, and a detection baseboard with a charge pattern is obtained.

According to the method for controlling the detection baseboard provided by the embodiment of the present disclosure, the charge pattern is controlled through electrical signals. By providing a new method of electrostatic imaging, the problem of low exposure accuracy caused by interference from the external light, when forming the charge pattern by controlling the light source exposure in related art, is avoided, and the accuracy of forming the charge pattern is improved. When the detection baseboard is applied to a printing device, the printing accuracy and printing clarity can be improved, avoiding printing blur caused by interference from external light during the exposure process. In addition, in the printing device, the light-shielding component in the related art can also be omitted, thereby simplifying the design of the printing device and reducing the cost.

Figure 21:
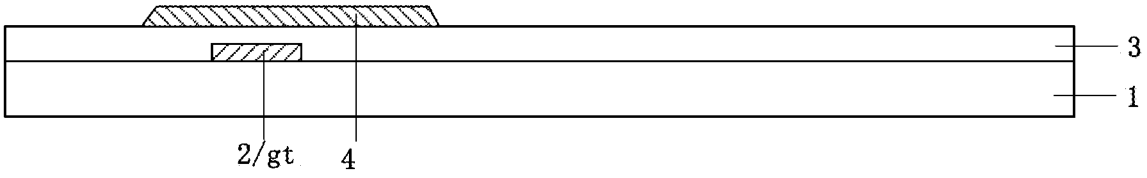
FIG. 21 to FIG. 24 are intermediate structural diagrams during a detection baseboard preparation method provided by the embodiment of the present disclosure.
Figure 22:
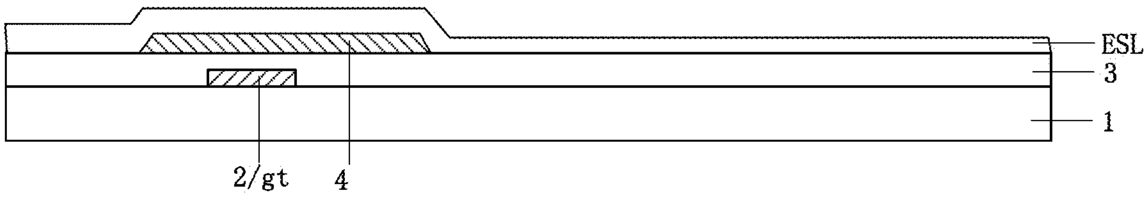
Figure 23:
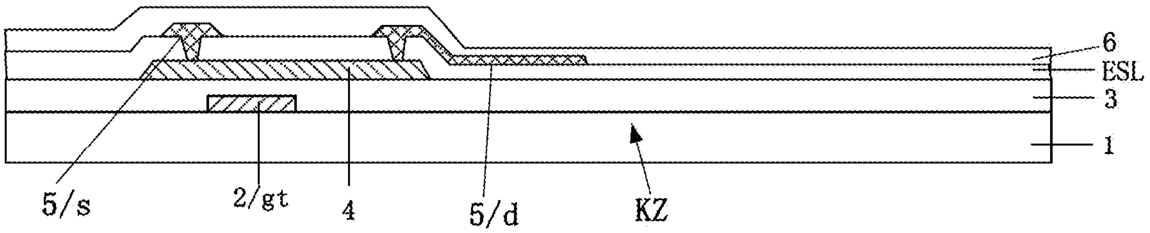
Figure 24:
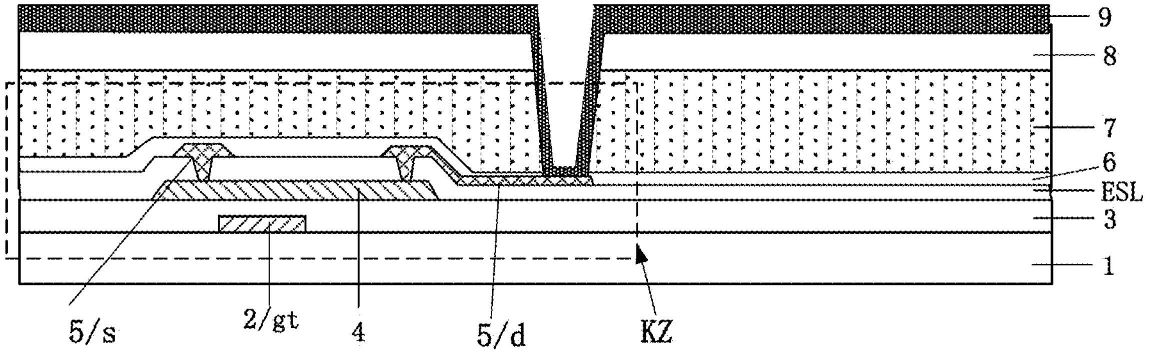

An embodiment of the present disclosure provides a method for preparing a detection baseboard, including:

S01, providing a substrate 1, and forming a first conductive layer 2 (for example a gate layer) on the substrate 1, as shown in FIG. 21;

S02, forming a gate insulating layer 3 on the first conductive layer 2;

S03, forming a semiconductor layer 4 on the gate insulating layer 3;

S04, forming an etch stop layer ESL on the semiconductor layer 4, as shown in FIG. 22;

S05, forming a second conductive layer 5 (for example a source-drain metal layer) on the etch stop layer ESL, as shown in FIG. 23;

S06, forming a first insulation layer 6 on the second conductive layer 5;

S07, forming an organic layer 7 on the first insulation layer 6;

S08, forming a second insulation layer 8 on the organic layer 7, as shown in FIG. 24;

S09, forming a first electrode 9 on the second insulation layer 8;

S010, forming a pixel definition layer and a pixel isolation structure, and then forming a charge transport layer 10.

The detection baseboard prepared by the detection baseboard preparation method provided by the embodiment of the present disclosure realizes the control of the charge pattern through electrical signals. By providing a new method of electrostatic imaging, the problem of low exposure accuracy caused by interference from the external light, when forming the charge pattern by controlling the light source exposure in related art, is avoided, and the accuracy of forming the charge pattern is improved. When the detection baseboard is applied to a printing device, the printing accuracy and printing clarity can be improved, avoiding printing blur caused by interference from external light during the exposure process. In addition, in the printing device, the light-shielding component in the related art can also be omitted, thereby simplifying the design of the printing device and reducing the cost.

It should be noted that the detection baseboard may also include other structures and layouts, and the preparation method of the detection baseboard may also include other processes and steps. The specification only introduces the preparation process related to the present application. For other preparation processes included, please refer to the relevant technologies and will not be described again here.

The above is only specific embodiments of the application, and the protection scope of the application is not limited thereto. Those skilled in the art can easily conceive of changes or replacements within the scope of the technology disclosed in this application, which should be covered within the scope of protection of the application. Therefore, the protection scope of the present application should be determined by the protection scope of the claims.

The invention claimed is:

1. A detection baseboard, comprising:

a substrate;

a plurality of data lines extending in a first direction and a plurality of gate lines extending in a second direction located on the substrate, wherein the first direction intersects with the second direction;

a plurality of sub-pixels arranged in an array, wherein the sub-pixels are located at positions defined by the data lines and the gate lines, and the sub-pixels are electrically connected to the data lines and the gate lines respectively;

wherein each of the sub-pixels comprises a control unit and a charge distribution unit, the control unit is electrically connected to the data line and the gate line, the charge distribution unit comprises a first electrode and a charge transport layer, the first electrode is electrically connected to the control unit, and an orthographic projection of the charge transport layer on the substrate covers an orthographic projection of the first electrode on the substrate; the charge distribution unit is configured to discharge under control of the control unit;

wherein the charge distribution unit further comprises a buffer layer and a charge injection layer, the buffer layer is located between the first electrode and the charge transport layer, and the charge injection layer is located between the buffer layer and the charge transport layer, wherein a polarity of charges injected by the charge injection layer is same as a polarity of charges transported by the charge transport layer.

2. The detection baseboard according to claim 1, further comprising a first signal line electrically connected to the control unit, when the charge distribution unit is in a full charge state, a voltage of a signal transmitted in the first signal line is less than a voltage of the first electrode;

wherein the first signal line is configured to transmit a signal with a constant voltage, and the charge distribution unit is configured to discharge to the first signal line along the control unit under the control of the control unit.

3. The detection baseboard according to claim 2, wherein the first signal line comprises a ground line or a negative power supply signal line.

4. The detection baseboard according to claim 2, wherein the control unit comprises at least two transistors, one of the at least two transistors is electrically connected to the data line, and the other one of the at least two transistors is electrically connected to the first signal line.

5. The detection baseboard according to claim 4, wherein the control unit comprises a first transistor and a second transistor, a gate of the first transistor is electrically connected to the data line, a first terminal of the first transistor is electrically connected to the first electrode, and a second terminal of the first transistor is electrically connected to a first terminal of the second transistor; a gate of the second transistor is electrically connected to the gate line, and a second terminal of the second transistor is electrically connected to the first signal line.

6. The detection baseboard according to claim 4, wherein the control unit comprises a first transistor and a second transistor, a gate of the first transistor is electrically connected to the data line, a first terminal of the first transistor is electrically connected to the first electrode, and a second terminal of the first transistor is shared with a first terminal of the second transistor; a gate of the second transistor is electrically connected to the gate line, and a second terminal of the second transistor is electrically connected to the first signal line.

7. The detection baseboard according to claim 4, wherein the control unit comprises a first transistor and a second transistor, a gate of the first transistor is electrically connected to the gate line, a first terminal of the first transistor is electrically connected to the data line, and a second terminal of the first transistor is electrically connected to a gate of the second transistor; a first terminal of the second transistor is electrically connected to the first electrode, and a second terminal of the second transistor is electrically connected to the first signal line.

8. The detection baseboard according to claim 1, wherein the charge transport layer comprises a hole transport layer, and each transistor in the control unit is a P-type transistor; or wherein the charge transport layer comprises an electron transport layer, and each transistor in the control unit is a N-type transistor.

9. The detection baseboard according to claim 5, comprising:

a first conductive layer located on a side of the substrate, wherein the first conductive layer comprises the gate lines and a gate of each of the transistors;

a semiconductor layer located on a side of the first conductive layer facing away from the substrate, wherein the semiconductor layer is insulated from the first conductive layer and comprises an active region of each of the transistors;

a second conductive layer located on a side of the semiconductor layer facing away from the substrate, wherein the second conductive layer comprises the data lines and a source and a drain of each of the transistors;

wherein for at least one transistor in the control unit, an orthographic projection of the gate on the substrate partially overlaps with an orthographic projection of the active region on the substrate.

10. The detection baseboard according to claim 9, wherein the orthographic projection of the gate of the first transistor on the substrate partially overlaps with the orthographic projection of the active region of the first transistor on the substrate;

the active region of the first transistor comprises a plurality of active parts and first bending parts connecting two adjacent active parts, and the orthographic projection of some of the first bending parts on the substrate is within the orthographic projection of the gate on the substrate.

11. The detection baseboard according to claim 9, wherein the orthographic projection of the gate of the first transistor on the substrate partially overlaps with the orthographic projection of the active region of the first transistor on the substrate;

the active region of the first transistor comprises a plurality of active parts, the second conductive layer comprises a plurality of second bending parts, and two adjacent active parts are electrically connected through the second bending part; the orthographic projection of the second bending part on the substrate and the orthographic projection of the gate on the substrate do not overlap with each other.

12. The detection baseboard according to claim 10, wherein a gap exists between two adjacent active parts, an area delineated by the orthographic projection of the gate on the substrate at least partially overlaps with an area delineated by the orthographic projection of an outer contour of a part of the gaps on the substrate.

13. The detection baseboard according to claim 1, further comprising a pixel definition layer and a plurality of pixel isolation structures, wherein the pixel definition layer is located on a side of the first electrode facing away from the substrate, the charge transport layer is located on a side of the pixel definition layer facing away from the substrate;

the pixel definition layer comprises a plurality of first openings and a plurality of second openings, an area delineated by the orthographic projection of the first electrode on the substrate overlaps with an area delineated by an outer contour of the first opening on the substrate, an area delineated by the orthographic projection of the pixel isolation structure on the substrate overlaps with an area delineated by the orthographic projection of an outer contour of the second opening on the substrate;

each of the pixel isolation structures is located between two adjacent sub-pixels, and the charge transport layer is disconnected at the pixel isolation structures.

14. The detection baseboard according to claim 1, wherein the substrate is a flexible substrate;

wherein in a first state, the charge transport layers in each of the sub-pixels are located on a same plane;

in a second state, the charge transport layers in each of the sub-pixels are located on a same curved surface, and a solid figure of the detection baseboard in the second state comprises a cylinder.

15. The detection baseboard according to claim 14, further comprising a first insulation layer, an organic layer and a second insulation layer that are stacked in sequence, the first insulation layer covers the control units, and the second insulation layer is located on a side of each of the first electrodes close to the substrate;

the first insulation layer is provided with a plurality of grooves in a region between two adjacent control units, and the organic layer extends into the grooves.

16. The detection baseboard according to claim 9, wherein a material of the semiconductor layer comprises metal oxide, the detection baseboard further comprises an etch stop layer covering the semiconductor layer, and the second conductive layer is located on a side of the etch stop layer facing away from the substrate.

17. A detection device, comprising the detection baseboard according to claim 1.

18. A printing device, comprising the detection baseboard according to claim 1, wherein the printing device further comprises: a charging device configured to charge the charge distribution units of the detection baseboard; and a driving chip configured to transmit a control signal to the detection baseboard.

19. A method for controlling a detection baseboard, wherein the detection baseboard comprises: a substrate; a plurality of data lines extending in a first direction and a plurality of gate lines extending in a second direction located on the substrate, wherein the first direction intersects with the second direction; a plurality of sub-pixels arranged in an array, wherein the sub-pixels are located at positions defined by the data lines and the gate lines, and the sub-pixels are electrically connected to the data lines and the gate lines respectively; wherein each of the sub-pixels comprises a control unit and a charge distribution unit, the control unit is electrically connected to the data line and the gate line, the charge distribution unit comprises a first electrode and a charge transport layer, the first electrode is electrically connected to the control unit, and an orthographic projection of the charge transport layer on the substrate covers an orthographic projection of the first electrode on the substrate; the charge distribution unit is configured to discharge under control of the control unit, wherein the charge distribution unit further comprises a buffer layer and a charge injection layer, the buffer layer is located between the first electrode and the charge transport layer, and the charge injection layer is located between the buffer layer and the charge transport layer, wherein a polarity of charges injected by the charge injection layer is same as a polarity of charges transported by the charge transport layer;

wherein the method comprises:

charging the detection baseboard so that the charge distribution units are in a full charge state;

inputting a first control signal to the control units of some of the sub-pixels, wherein the first control signal is configured to control the charge distribution unit of the sub-pixel to discharge so that a surface of the charge distribution unit is not carried with charges; and inputting a second control signal to the control units of some of the sub-pixels, wherein the second control signal is configured to control the charge distribution unit of the sub-pixel to hold charges; and obtaining the detection baseboard with a charge pattern.

* * * * *